US012660113B2

(12) United States Patent
Chen

(10) Patent No.: US 12,660,113 B2
(45) Date of Patent: Jun. 16, 2026

(54) SPLICING SCREEN AND SPLICING DISPLAY APPARATUS

(71) Applicant: Tianma Advanced Display Technology Institute (Xiamen) Co., Ltd., Xiamen (CN)

(72) Inventor: Donghua Chen, Xiamen (CN)

(73) Assignee: Tianma Advanced Display Technology Institute (Xiamen) Co., Ltd., Xiamen (CN)

( * ) Notice: Subject to any disclaimer, the term of this patent is extended or adjusted under 35 U.S.C. 154(b) by 338 days.

(21) Appl. No.: 18/465,459

(22) Filed: Sep. 12, 2023

(65) Prior Publication Data

US 2024/0008193 A1 Jan. 4, 2024

(30) Foreign Application Priority Data

Jun. 21, 2023 (CN) ......................... 202310740151.X

(51) Int. Cl.
 *H05K 5/30* (2025.01)
(52) U.S. Cl.
 CPC ..................................... *H05K 5/30* (2025.01)
(58) Field of Classification Search
 CPC ....................................................... H05K 5/03
 USPC ....................................................... 361/730
 See application file for complete search history.

(56) References Cited

U.S. PATENT DOCUMENTS

| | | | |
|---|---|---|---|
| 5,602,978 A * | 2/1997 | Lastinger | G06T 15/10 |
| | | | 353/7 |
| 2009/0066858 A1* | 3/2009 | Turner | G03B 37/04 |
| | | | 348/E9.027 |
| 2019/0333424 A1* | 10/2019 | Zhu | G09F 9/33 |

FOREIGN PATENT DOCUMENTS

| | | | |
|---|---|---|---|
| CN | 207752716 U | 8/2018 | |
| CN | 208368063 U * | 1/2019 ............... G09F 9/33 |
| CN | 216772729 U | 6/2022 | |
| CN | 115171541 A | 10/2022 | |
| CN | 115223455 A | 10/2022 | |

OTHER PUBLICATIONS

First Office Action (with translation) received Oct. 18, 2025, for Chinese Application No. 202310740151.X, filed Jun. 21, 2023; 22 pages total.

* cited by examiner

*Primary Examiner* — Hung S. Bui
(74) *Attorney, Agent, or Firm* — Christensen O'Connor Johnson Kindness PLLC

(57) ABSTRACT

A splicing screen and a splicing display apparatus are provided. The splicing screen includes display screens. One of the display screens includes two opposite first edges and two opposite second edges. The two opposite first edges are not parallel to each other. The two opposite second edges have different lengths. The splicing screen at least includes two adjacent display screens. An angle is formed between the two display screens spliced at a corresponding first edge of the two opposite first edges.

20 Claims, 21 Drawing Sheets

$9\_1 \atop 10\_1 \Big\}3\_1$  $\quad$  $9\_2 \atop 10\_2 \Big\}3\_2$ $9\_3 \atop 10\_3 \Big\}3\_3$  $\quad$  $9\_4 \atop 10\_4 \Big\}3\_4$

FIG. 8

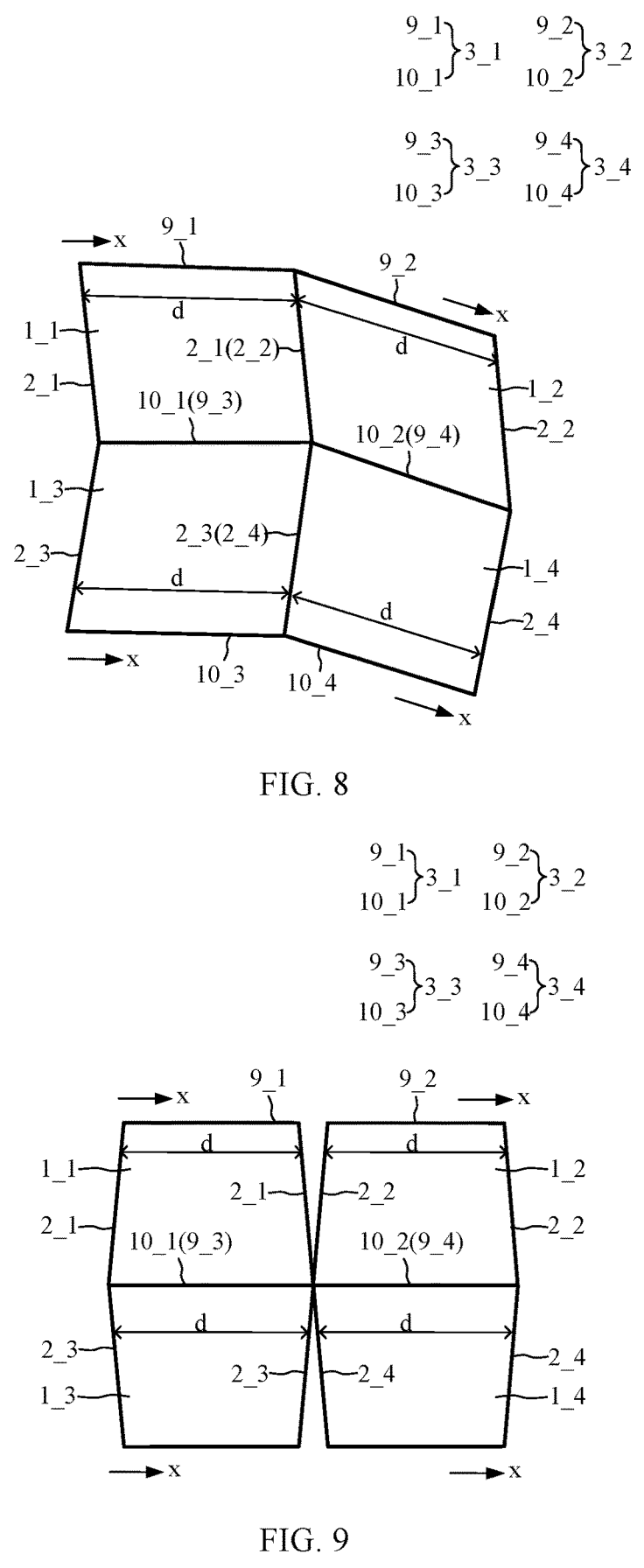

$9\_1 \atop 10\_1 \Big\}3\_1$  $\quad$  $9\_2 \atop 10\_2 \Big\}3\_2$ $9\_3 \atop 10\_3 \Big\}3\_3$  $\quad$  $9\_4 \atop 10\_4 \Big\}3\_4$

FIG. 9

$9\_1 \brace 10\_1 \} 3\_1$  $9\_2 \brace 10\_2 \} 3\_2$ $9\_3 \brace 10\_3 \} 3\_3$  $9\_4 \brace 10\_4 \} 3\_4$ $9\_1 \brace 10\_1 \} 3\_1$  $9\_2 \brace 10\_2 \} 3\_2$ $9\_3 \brace 10\_3 \} 3\_3$  $9\_4 \brace 10\_4 \} 3\_4$

SPLICING SCREEN AND SPLICING DISPLAY APPARATUS

CROSS-REFERENCE TO RELATED APPLICATIONS

The present application claims priority to Chinese Patent Application No. 202310740151.X, filed on Jun. 21, 2023, the content of which is incorporated herein by reference in its entirety.

TECHNICAL FIELD

The present disclosure relates to the field of display technologies, and in particular, to a splicing screen and a splicing display apparatus.

BACKGROUND

A large display screen used in public is usually formed by splicing multiple display screens so that the large display screen can have a larger display area to meet a requirement of people watching from a distance. However, most existing large display screens are flat display screens, which cannot meet current diversified market requirements.

SUMMARY

In a first aspect, the present disclosure provides a splicing screen. The splicing screen comprises display screens. One of the display screens comprises two opposite first edges and two opposite second edges, the two opposite first edges are not parallel to each other, and the two opposite second edges have different lengths. At least two of the display screens are adjacent to each other, an angle is formed between two display screens spliced at at a corresponding first edge of the two opposite first edges.

In a second aspect, the present disclosure provides a splicing display apparatus. The splicing display apparatus includes a splicing screen. The splicing screen comprises display screens. One of the display screens comprises two opposite first edges and two opposite second edges, the two opposite first edges are not parallel to each other, and the two opposite second edges have different lengths. At least two of the display screens are adjacent to each other, an angle is formed between two display screens spliced at at a corresponding first edge of the two opposite first edges.

BRIEF DESCRIPTION OF DRAWINGS

To describe the technical solutions in the embodiments of the present disclosure more clearly, the following briefly describes the accompanying drawings required to be used in the embodiments. The accompanying drawings in the following description show merely some embodiments of the present disclosure, and a person skilled in the art may still derive other accompanying drawings from these accompanying drawings.

FIG. 8 is a structural schematic diagram of a splicing screen according to another embodiment of the present disclosure;

FIG. 9 is a schematic diagram of four display screens shown in FIG. 8 in a tiling state;

DESCRIPTION OF EMBODIMENTS

In order to better understand technical solutions of the present disclosure, the embodiments of the present disclosure are described in detail with reference to the drawings.

It should be clear that the described embodiments are merely part of the embodiments of the present disclosure rather than all of the embodiments. All other embodiments obtained by those skilled in the art shall fall into the protection scope of the present disclosure.

The terms used in the embodiments of the present disclosure are merely for the purpose of describing specific embodiment, rather than limiting the present disclosure. The terms "a", "an", "the" and "said" in a singular form in the embodiment of the present disclosure and the attached claims are also intended to include plural forms thereof, unless noted otherwise.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects in front and at the back of "/" is an "or" relationship.

Figure 1:
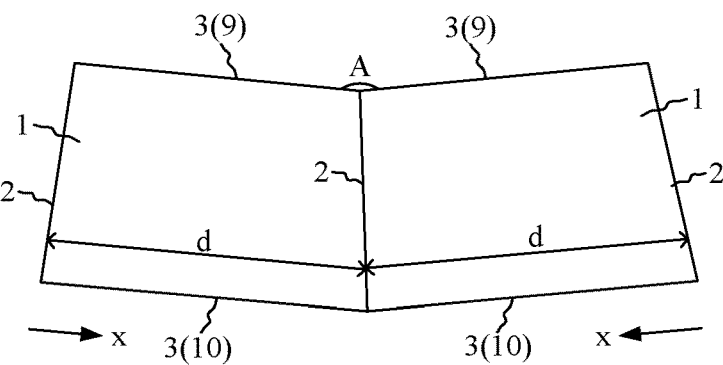
FIG. 1 is a structural schematic diagram of a splicing screen according to an embodiment of the present disclosure.

The embodiments of the present disclosure provide a splicing screen, as shown in FIG. 1. FIG. 1 is a structural schematic diagram of a splicing screen according to an embodiment of the present disclosure. The splicing screen includes a display screen 1. The display screen 1 includes two opposite first edges 2 and two opposite second edges 3. The two opposite first edges 2 are not parallel to each other. The two opposite second edges 3 have different lengths.

The splicing screen at least includes two adjacent display screens 1. An angle A is formed between the two display screens 1 spliced at the first edge 2. That is, the two display screens 1 spliced at the first edge 2 are not on a same plane. When the splicing screen includes multiple display screens 1, for different two display screens 1 spliced at the first edge 2, an angle A is formed between the two display screens 1 may be different.

Figure 2:
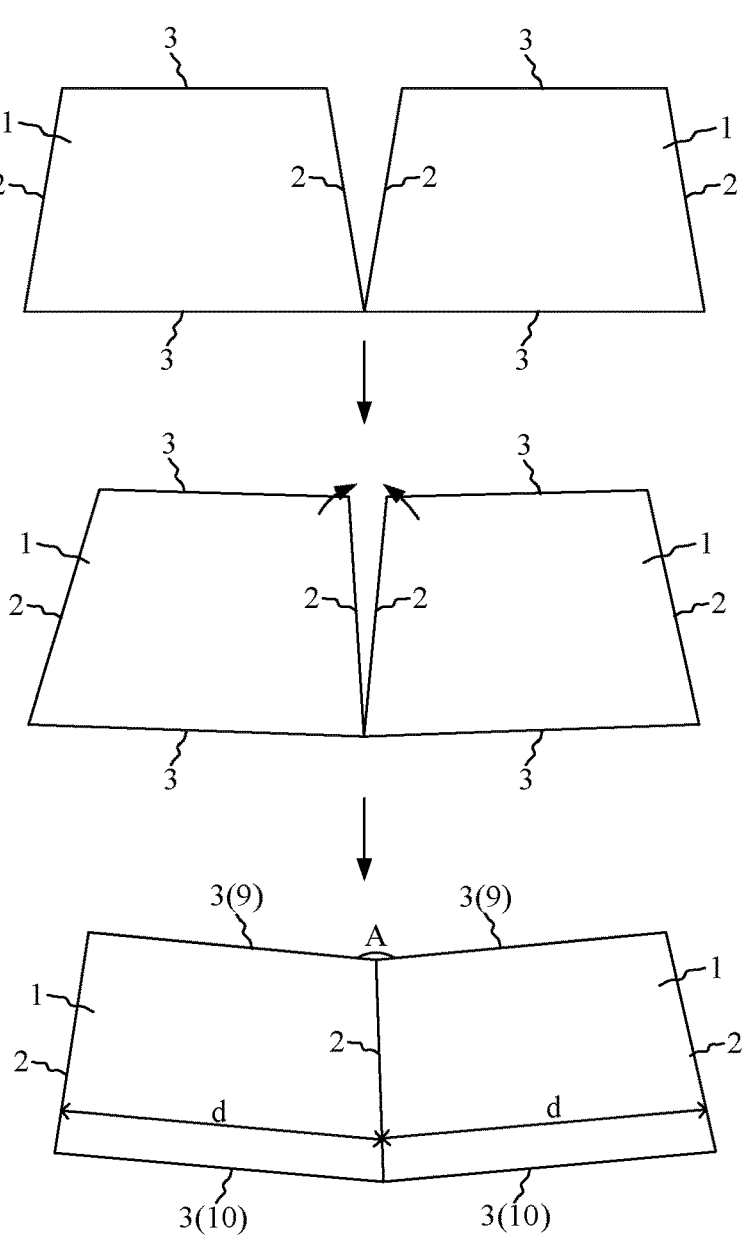
FIG. 2 is a schematic diagram of two display screens shown in FIG. 1 converting from a tiling state to a splicing state according to an embodiment of the present disclosure.
Figures 3, 4:
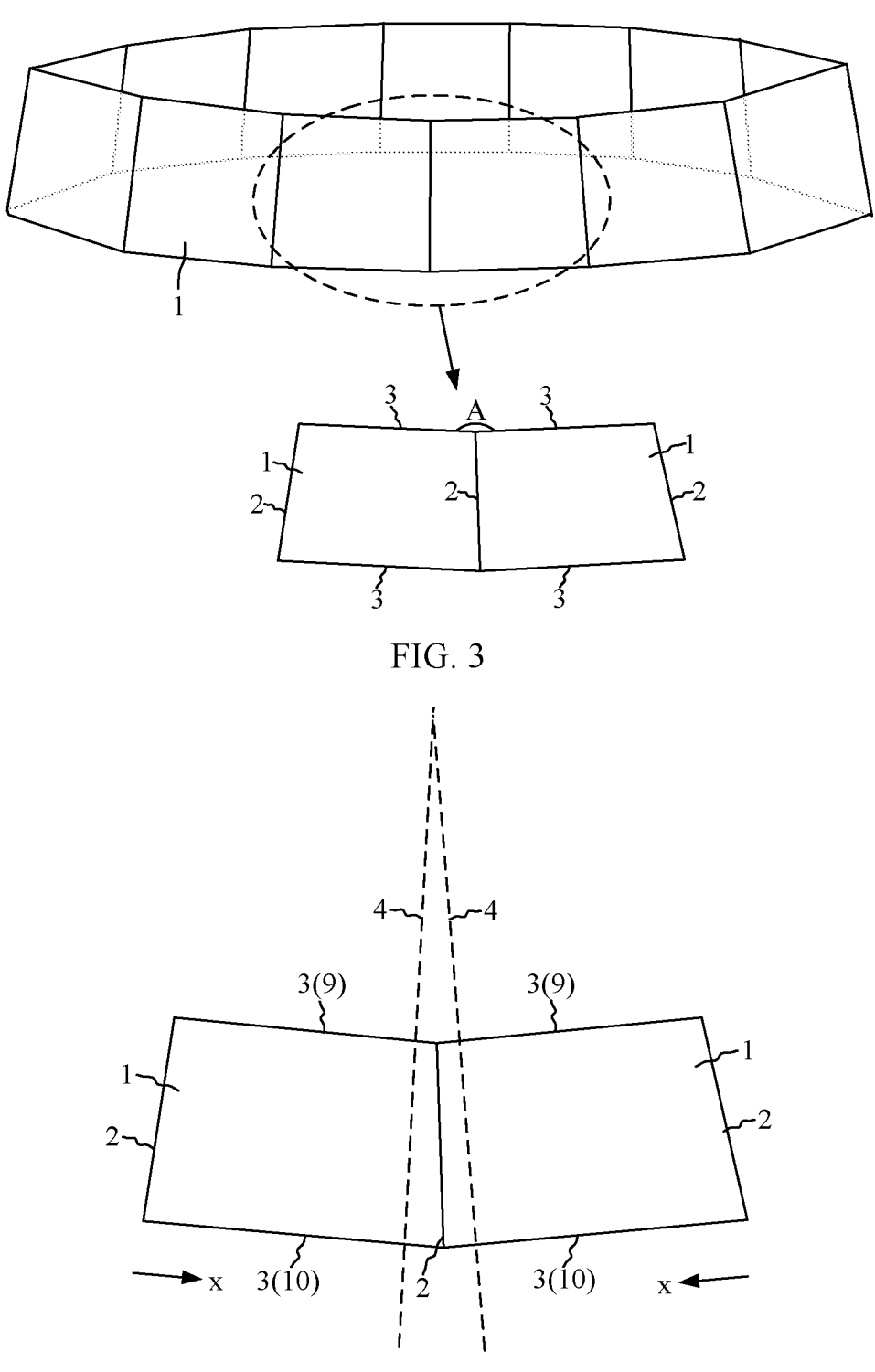
FIG. 3 is a structural schematic diagram of a splicing screen according to another embodiment of the present disclosure.
FIG. 4 is a schematic diagram of a first virtual axis according to an embodiment of the present disclosure.

The display screen 1 included in the splicing screen provided in the embodiments of the present disclosure is a profiled display screen with the two first edges 2 that are not parallel to each other. Based on this design, referring to FIG. 2, FIG. 2 is a schematic diagram of the two display screens 1 shown in FIG. 1 converting from a tiling state to a splicing state. For the two display screens 1 that need to be spliced at the first edge 2, when the two display screens 1 are in the tiling state, there is a gap between the first edges 2 of the two display screens 1. The two display screens 1 are close to each other to be spliced and form the angle A therebetween. A screen formed by the two display screens can be in a bending form with upward or downward convergence. In this way, the splicing screen can have a design with a more flexible and diversified appearance, to better meet a current market requirement for a form of a large display screen. In particular, when the splicing screen includes a large number of display screens 1, the splicing screen may have more screen forms. For example, referring to FIG. 3, FIG. 3 is a structural schematic diagram of a splicing screen according to another embodiment of the present disclosure. The splicing screen may be in an annular form, and an upper end portion of the annular screen converges inward.

The process in which the at least two display screens 1 transition from the tiling state to the splicing state in the embodiments of the present disclosure may be a process existing before the splicing screen leaves the factory or a process existing during application of the splicing screen.

If the process exists before the splicing screen leaves the factory, in a process of manufacturing the splicing screen, multiple display screens 1 included in the splicing screen need to be tiled on a carrier first. At this time, at least two display screens 1 are in the tiling state. Then, at least two display screens 1 are fastened to make the splicing screen be in a fixed screen form. At this time, at least two display screens 1 have converted from the tiling state to the splicing state.

It may be understood that at least two display screens 1 may be fastened through adhesive bonding or in another manner, which is not limited in the present disclosure.

If the process exists during the application of the splicing screen, the splicing screen after leaving the factory can be switched between flattening and bending. When the splicing screen is flattened, at least two display screens 1 in the splicing screen are in the tiling state. When the splicing screen is bent, at least two display screens 1 in the splicing screen are in the splicing state. When the splicing screen switches from flattening to bending, at least two display screens 1 in the splicing screen switches from the tiling state to the splicing state.

In an embodiment of the present disclosure, referring to FIG. 1 and FIG. 2 again, the two opposite second edges 3 of the display screen 1 are parallel to each other. In this case, shape of the display screen 1 may be designed as a regular shape such as a trapezoid. This not only can reduce design difficulty of the display screen 1, but also can better control an overall form of the splicing screen when the splicing screen includes multiple display screens 1.

In an embodiment of the present disclosure, referring to FIG. 4, FIG. 4 is a schematic diagram of a first virtual axis 4 according to an embodiment of the present disclosure. For the two display screens 1 spliced at the first edge 2, first virtual axes 4 of the two display screens 1 intersect. The first virtual axes 4 of the two display screens 1 are located on a same plane. The first virtual axes 4 of the display screens 1 are perpendicular to an arrangement direction of the two first edges 2.

Since orientations and positions of different display screens 1 in the splicing screen are different, arrangement directions of two first edges 2 of different display screens 1 are different.

When the display screen 1 is a flat display screen, referring to FIG. 4, the arrangement direction x of the two first edges 2 of the display screen 1 is parallel to a plane of the display screen 1 and is parallel to an extension direction of a straight line connecting two endpoints of one second edge 3. For example, when the second edges 3 are straight edges, the arrangement direction x of the two first edges 2 is parallel to an extension direction of one second edge 3. Further, when the two second edges 3 of the display screen 1 are parallel, the arrangement direction x of the two first edges 2 of the display screen 1 is parallel to an extension direction of the two second edges 3. In addition, for the two display screens 1 spliced at the first edge 2, the two display screens 1 are not on the same plane, but the first virtual axes 4 of the two display screens 1 are on the same plane. Therefore, the first virtual axis 4 of the display screen 1 is not parallel to the plane of the display screen 1.

Figure 5:
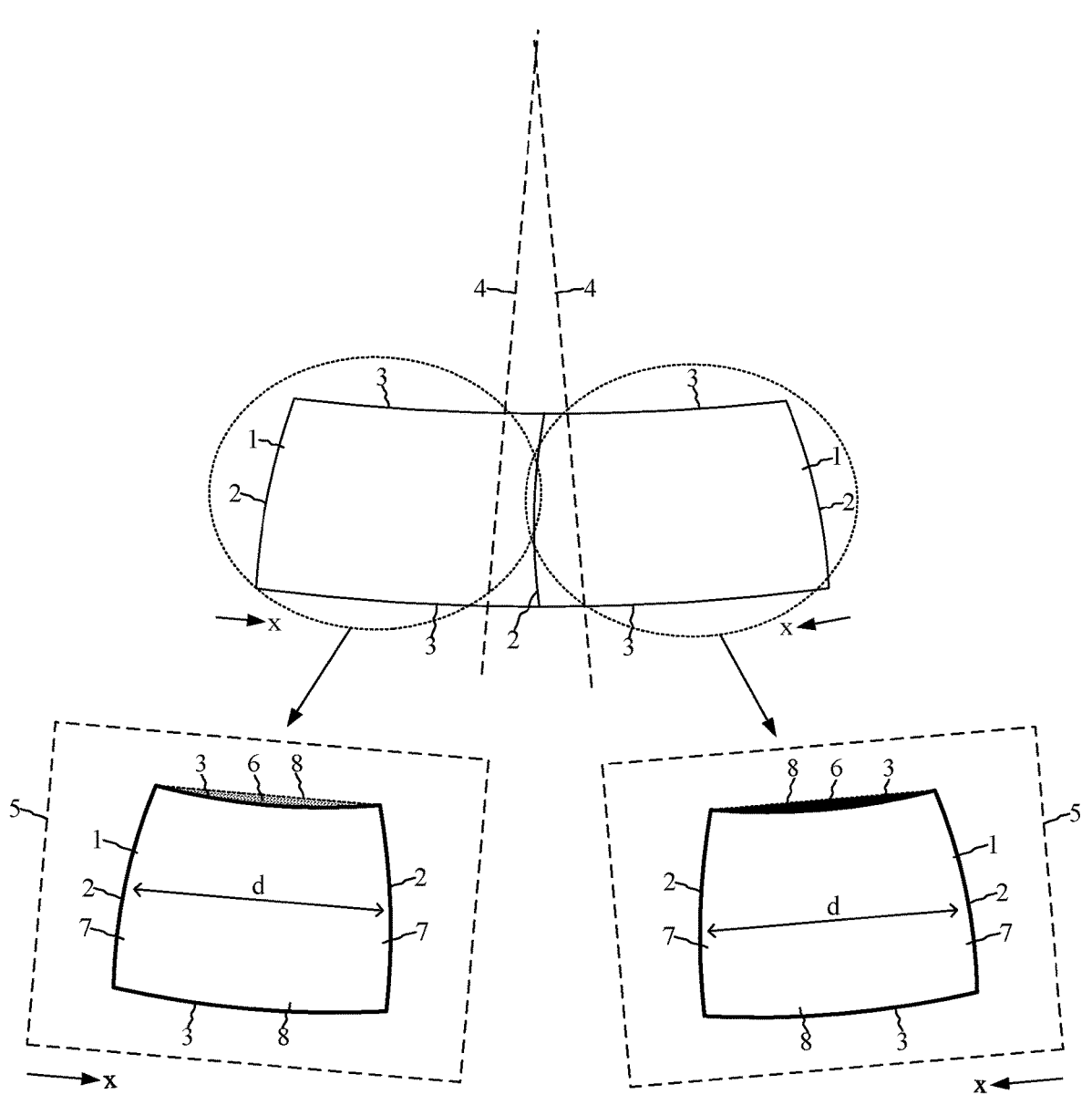
FIG. 5 is a schematic diagram of a first virtual axis according to another embodiment of the present disclosure.

Alternatively, when the display screen 1 is a curved display screen, as shown in FIG. 5, FIG. 5 is a schematic diagram of a first virtual axis 4 according to another embodiment of the present disclosure. For a single display screen 1 in the splicing screen, in a direction of being opposite to the display screen 1, the display screen 1 has an orthographic projection 6 on a first plane 5. The orthographic projection 6 includes first projection edges 7 corresponding to the first edges 2 and second projection edges 8 corresponding to the second edges 3. An arrangement direction x of the two first edges 2 of the display screen 1 is parallel to the first plane 5 corresponding to the display screen 1 and parallel to an extension direction of a straight line connecting two endpoints of one second projection edge 8 of the orthographic projection 6. For example, when the second projection edges 8 are straight edges, the arrangement direction x of the two first edges 2 is parallel to an extension direction of one second projection edge 8. Further, when the two second projection edges 8 of the orthographic projection 6 are parallel, the arrangement direction x of the two first edges 2 of the display screen 1 is parallel to an extension direction of the two second projection edges 8. In addition, for two display screens 1 spliced at the first edge 2, two first planes 5 corresponding to the two display screens 1 are not on a same plane, but first virtual axes 4 of the two display screens 1 are on a same plane. Therefore, the first virtual axis 4 of the display screen 1 is not parallel to the first plane 5 corresponding to the display screen 1.

Based on the foregoing design, a screen formed by the two display screens 1 spliced at the first edge 2 is in a bending form with upward or downward convergence so that the splicing screen can have a design with more flexible and diversified appearance.

In an embodiment of the present disclosure, to reduce design difficulty and manufacturing costs of the display screen 1, still referring to FIG. 4, the display screen 1 in the splicing screen may be a flat display screen.

Figure 12:
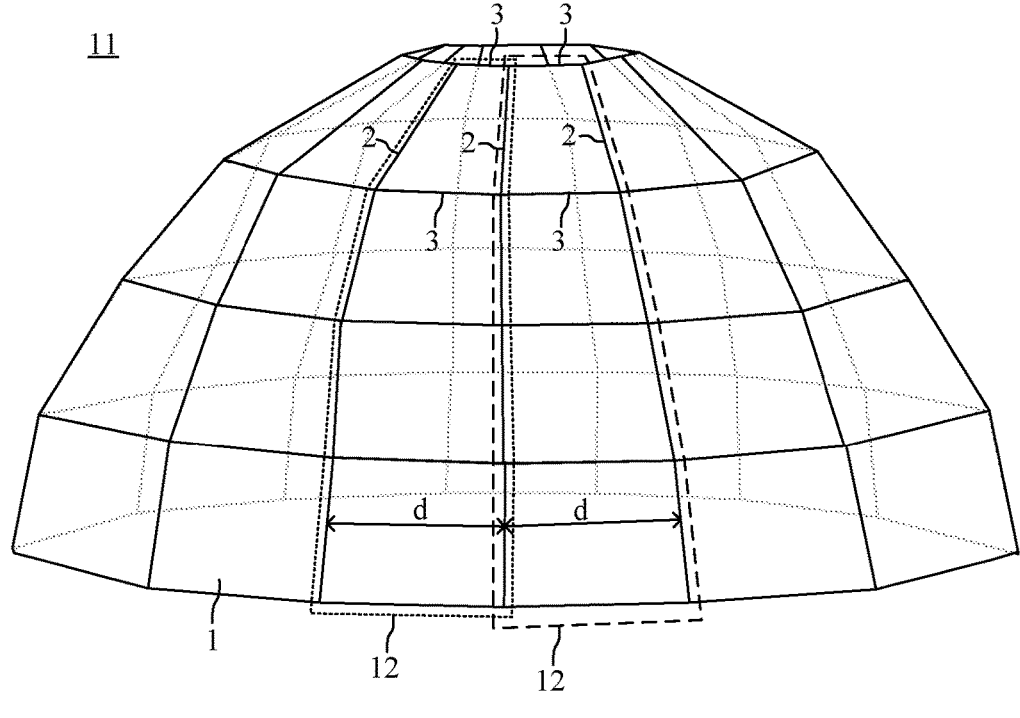
FIG. 12 is a structural schematic diagram of a splicing screen according to another embodiment of the present disclosure.
Figure 14:
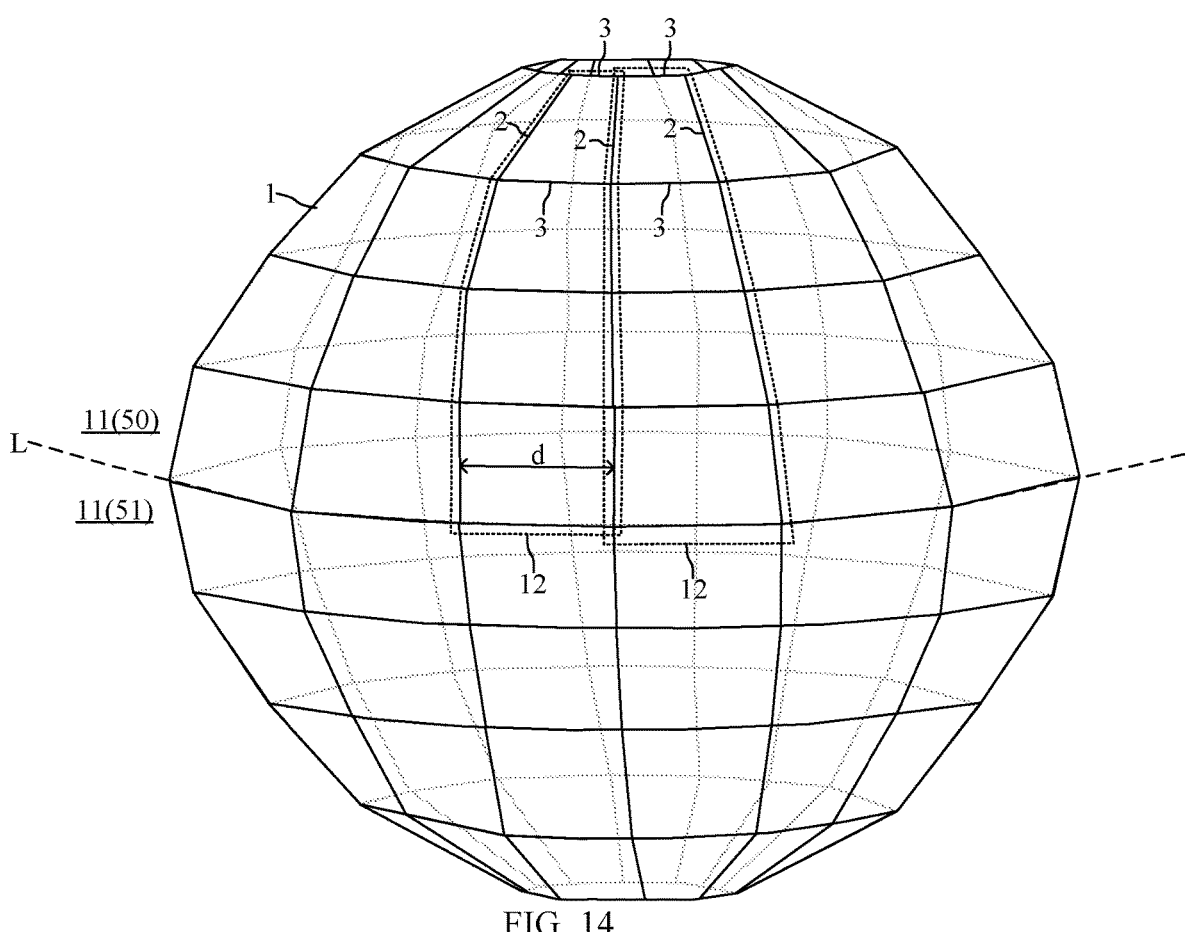
FIG. 14 is a structural schematic diagram of a splicing screen according to another embodiment of the present disclosure.

However, referring to FIG. 3, FIG. 12, and FIG. 14, when the splicing screen includes multiple display screens 1, even if a single display screen 1 is of a planar structure, an overall screen formed by splicing multiple display screens 1 can still be in a form of a non-planar and approximately smooth curved surface such as a spherical surface.

Figure 6:
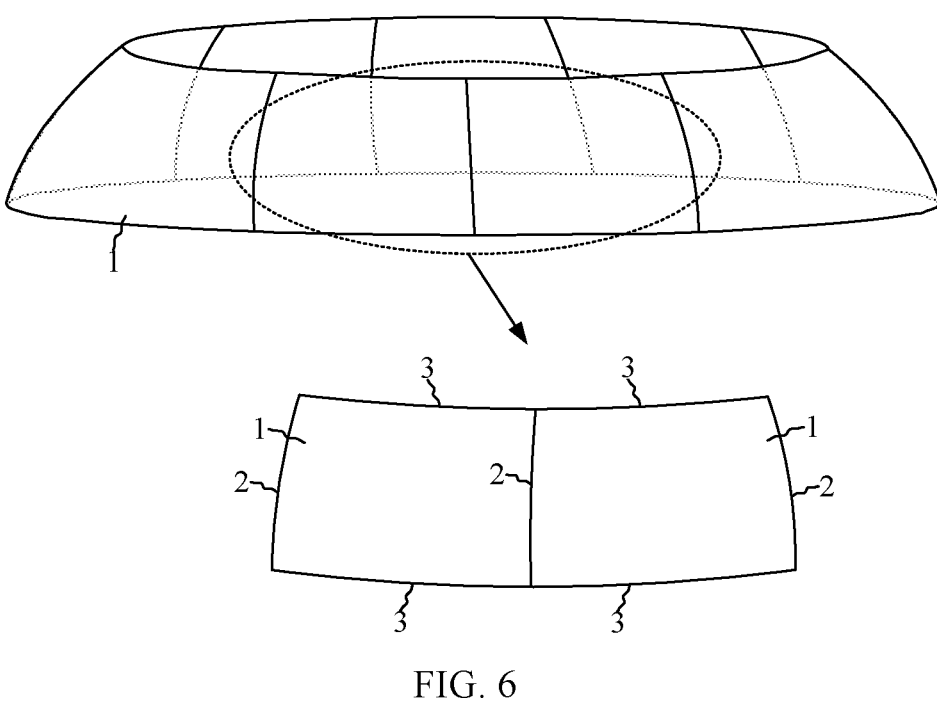
FIG. 6 is a structural schematic diagram of a splicing screen according to another embodiment of the present disclosure.

Alternatively, in an embodiment of the present disclosure, to further optimize the appearance design of the splicing screen so that the splicing screen is in a form of flexible and curved surface without corners, as shown in FIG. 6 with reference to FIG. 5, FIG. 6 is a structural schematic diagram of a splicing screen according to another embodiment of the present disclosure. The display screen 1 in this embodiment of the present disclosure may alternatively be a curved display screen.

In an embodiment of the present disclosure, referring to FIG. 1 again, the display screen 1 has a first width d in the arrangement direction x of the two first edges 2. The first width d of the display screen 1 gradually changes.

It should be noted that, referring to FIG. 5, when the display screen 1 is a curved display screen, in combination with the foregoing description of the arrangement direction x of the two first edges 2 of the curved display screen, the first width d of the display screen 1 in the arrangement direction x of the two first edges 2 can be understood as a width of the orthographic projection 6 of the display screen 1 on the first plane 5 in the arrangement direction of the two first projection edges 7.

When the first width d of the display screen 1 gradually changes, referring to FIG. 2, for the two display screens 1 that need to be spliced at the first edge 2, a width of a gap between them also gradually changes in a tiling state of the two display screens 1. Therefore, when being close to each other to be spliced, the two display screens 1 may be in close contact at a splicing position, to avoid a splicing gap, thereby improving a splicing effect.

Further, referring to FIG. 1 again, the two opposite second edges 3 of the display screen 1 include a first sub-edge 9 and a second sub-edge 10. For the two display screens 1 spliced at the first edge 2, the first widths d of the two display screens 1 both gradually decrease or increase in a direction from the first sub-edge 9 to the second sub-edge 10, to better make the screen formed by the two display screens 1 be in the bending form with upward or downward convergence.

Figure 7:
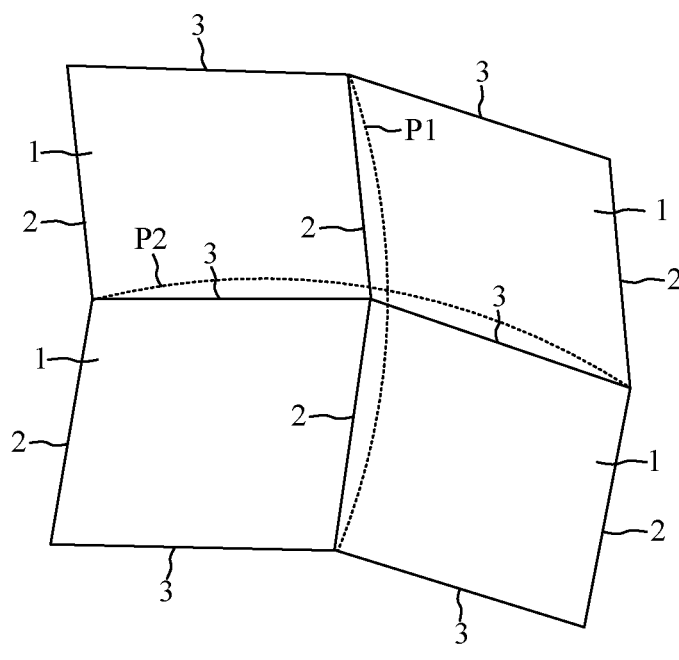
FIG. 7 is a structural schematic diagram of a splicing screen according to another embodiment of the present disclosure.

In an embodiment of the present disclosure, referring to FIG. 7, FIG. 7 is a structural schematic diagram of a splicing screen according to another embodiment of the present disclosure. The splicing screen includes at least four adjacent display screens 1. For any display screen 1 of the four adjacent display screens 1, the display screen 1 is spliced with another display screen 1 at each of one first edge 2 and one second edge 3. An angle is formed between any two adjacent display screens 1 of the four adjacent display screens 1. Further, for the two display screens 1 spliced at the first edge 2, first virtual axes 4 of the two display screens 1 intersect.

In this way, a screen formed by the four adjacent display screens 1 can tend to present a biaxial curved surface that is biaxially bent along a first bending axis P1 and a second bending axis P2. A screen formed by any two adjacent display screens 1 of the four display screens 1 may be in a converging form at a side, which further broadens flexibility of the appearance design of the splicing screen. For example, when the splicing screen includes multiple display screens 1, the splicing screen may implement hemispherical or semi-ellipsoidal display shown in FIG. 12, or spherical or ellipsoidal display shown in FIG. 14. Especially when the first width d of the display screen 1 gradually changes, the four adjacent display screens 1 can be in close contact with each other without gaps, to avoid a crack, a wrinkle, or the like on the splicing screen.

When the splicing screen includes at least the foregoing four adjacent display screens 1, in an embodiment of the present disclosure, referring to FIG. 8 and FIG. 9, FIG. 8 is a structural schematic diagram of a splicing screen according to another embodiment of the present disclosure, and FIG. 9 is a schematic diagram of four display screens 1 shown in FIG. 8 in a tiling state. The display screen 1 has the first width d in the arrangement direction x of the two first edges 2. The two opposite second edges 3 of the display screen 1 include a first sub-edge 9 and a second sub-edge 10. For two display screens 1 spliced at the second edge 3, the second sub-edge 10 of one display screen 1 is adjacent to the first sub-edge 9 of the other display screen 1. The first width d of one display screen 1 gradually increases in a direction from the first sub-edge 9 to the second sub-edge 10. The first width d of the other display screen 1 gradually decreases in the direction from the first sub-edge 9 to the second sub-edge 10.

For clarity, in FIG. 8 and FIG. 9, an $i^{th}$ display screen is denoted by a reference numeral 1_*i*. A first edge of the $i^{th}$ display screen 1_*i* is denoted by a reference numeral 2_*i*. A second edge of the $i^{th}$ display screen 1_*i* is denoted by a reference numeral 3_*i*. A first sub-edge of the $i^{th}$ display screen 1_*i* is denoted by a reference numeral 9_*i*. A second sub-edge of the $i^{th}$ display screen 1_*i* is denoted by a reference numeral 10_*i*. Values of i are 1, 2, 3 or 4.

Based on the foregoing arrangement manner, among the four adjacent display screens 1, a screen formed by two display screens 1 spliced at the first edge 2 converges upward, and a screen formed by the other two display screens 1 spliced at the first edge 2 converges downward. Such a design can enable the splicing screen to implement spherical or ellipsoidal display shown in FIG. 14.

Figures 10, 11:
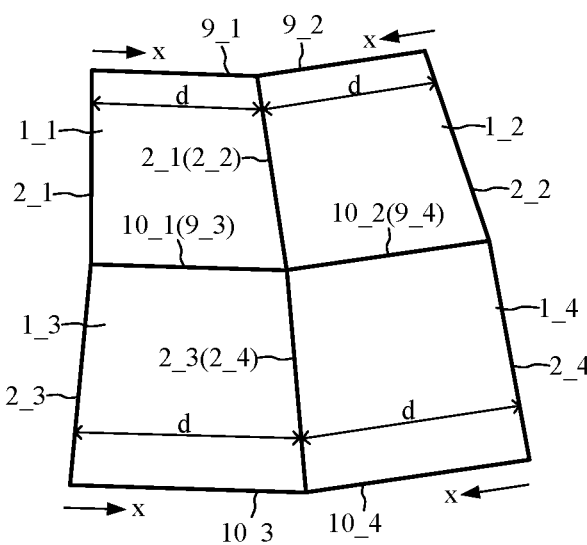
FIG. 10 is a structural schematic diagram of a splicing screen according to another embodiment of the present disclosure.
FIG. 11 is a schematic diagram of four display screens shown in FIG. 10 in a tiling state.

When the splicing screen includes at least the foregoing four adjacent display screens 1, in an embodiment of the present disclosure, referring to FIG. 10 and FIG. 11, FIG. 10 is a structural schematic diagram of a splicing screen according to another embodiment of the present disclosure, and FIG. 11 is a schematic diagram of four display screens 1 shown in FIG. 10 in a tiling state. The display screen 1 has the first width d in the arrangement direction x of the two first edges 2. The two opposite second edges 3 of the display screen 1 include a first sub-edge 9 and a second sub-edge 10. For two display screens 1 spliced at the second edge 3, the second sub-edge 10 of one display screen 1 is adjacent to the first sub-edge 9 of the other display screen 1. The first widths d of the two display screens 1 both gradually increase or both decrease in a direction from the first sub-edge 9 to the second sub-edge 10. The first sub-edge 9 and the second sub-edge 10 adjacent to each other in the two display screens 1 have a same length.

For clarity, in FIG. 10 and FIG. 11, an $i^{th}$ display screen is denoted by a reference numeral 1_*i*. A first edge of the $i^{th}$ display screen 1_*i* is denoted by a reference numeral 2_*i*. A second edge of the $i^{th}$ display screen 1_*i* is denoted by a reference numeral 3_*i*. A first sub-edge of the $i^{th}$ display screen 1_*i* is denoted by a reference numeral 9_*i*. A second sub-edge of the $i^{th}$ display screen 1_*i* is denoted by a reference numeral 10_*i*. Values of i are 1, 2, 3 or 4.

Based on the foregoing arrangement manner, among the four adjacent display screens 1, a screen formed by two display screens 1 spliced at the first edge 2 all converges upward or downward. This design can enable the splicing screen to implement hemispherical or semi-ellipsoidal display shown in FIG. 12. In addition, when the first sub-edge 9 and the second sub-edge 10 adjacent to each other in the two display screens 1 spliced at the second edge 3 have the same length, the first widths d of the two display screens 1 uniformly, smoothly, and gradually decrease or increase. There is no gap at a splicing position when the four display screens are spliced with each other. This can effectively improve a display effect of the splicing screen.

Figure 13:
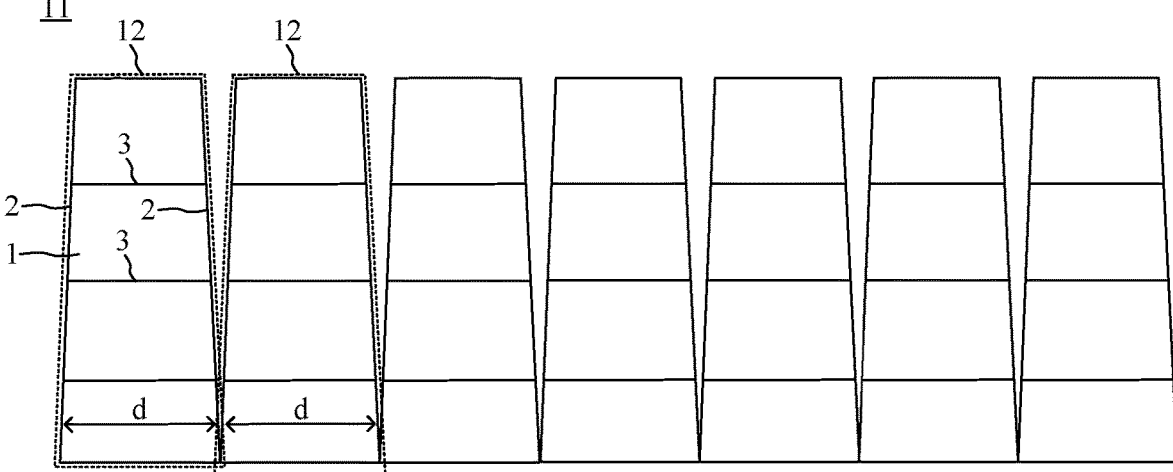
FIG. 13 is a schematic diagram of multiple display screens shown in FIG. 12 in a tiling state.
Figure 15:
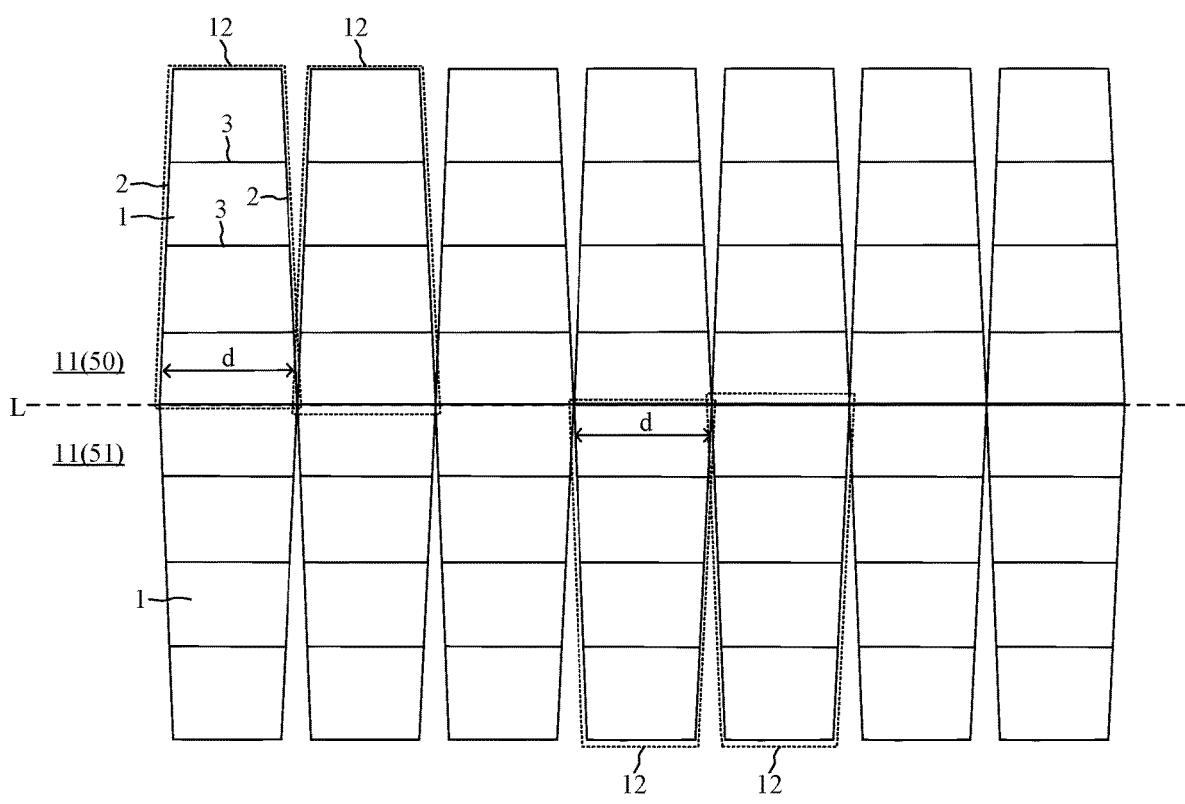
FIG. 15 is a schematic diagram of multiple display screens shown in FIG. 14 in a tiling state.

In an embodiment of the present disclosure, referring to FIG. 12 to FIG. 15, FIG. 12 is a structural schematic diagram of a splicing screen according to another embodiment of the present disclosure, FIG. 13 is a schematic diagram of multiple display screens 1 shown in FIG. 12 in a tiling state, FIG. 14 is a structural schematic diagram of a splicing screen according to another embodiment of the present disclosure, and FIG. 15 is a schematic diagram of multiple display screens 1 shown in FIG. 14 in a tiling state. The splicing screen includes at least one splicing sub-screen 11. The splicing sub-screen 11 includes at least two splicing units 12. Display screens 1 in two adjacent splicing units 12 are spliced at the first edge 2. The splicing unit 12 includes at least one display screen 1. An angle is formed between any two adjacent display screens 1 in the splicing sub-screen 11.

In combination with the foregoing analysis, based on the appearance design of a single display screen 1 in the splicing screen, when the splicing screen includes a large number of display screens 1, the splicing screen may have more screen forms so that the splicing screen has a design with more flexible and diversified appearance. For example, when the splicing unit 12 includes multiple display screens 1, the splicing screen may be in a hemispherical or semi-ellipsoidal form shown in FIG. 12 or in a spherical or ellipsoidal form shown in FIG. 14. When the splicing unit 12 includes one display screen 1, the splicing screen may be in a biaxial curved form with narrow ends and wide middle shown in FIG. 18 or in a biaxial curved form with an equal width shown in FIG. 21, so as to better meet a current market requirement for a large display screen.

In an embodiment of the present disclosure, referring to FIG. 12 and FIG. 13 again, the splicing unit 12 includes at least two display screens 1. The at least two display screens 1 are sequentially spliced at the second edge 3. The display screen 1 has a first width d in an arrangement direction of the two first edges 2. The first widths d of multiple display screens 1 in the splicing unit 12 gradually decrease in an arrangement direction of multiple display screens 1. The splicing sub-screen 11 includes a first side and a second side opposite to each other. In the at least two splicing units 12 of the splicing sub-screen 11, the first widths d of the display screens 1 closest to the first side are the smallest or the largest.

In this arrangement manner, referring to FIG. 13, when multiple display screens 1 included in the splicing screen are in the tiling state, a single splicing unit 12 in the splicing sub-screen 11 has a shape with a gradually changing width. Widths of different splicing units 12 gradually decrease in a same direction so that there is a gap with a gradually changing width between adjacent splicing units 12. Widths of gaps between different splicing units 12 gradually decrease in a same direction. In this way, when the adjacent splicing units 12 are close to each other to be spliced, the splicing sub-screen 11 can be biaxially bent and converge upward or downward so that the splicing sub-screen 11 tends to be more hemispherical. In addition, based on the foregoing design, the splicing units 12 can be in close contact with each other, to avoid a wrinkle, a crack, and the like between the splicing units 12 after splicing.

In an embodiment of the present disclosure, referring to FIG. 12 and FIG. 14 again, the splicing sub-screen 11 includes multiple splicing units 12. The splicing unit 12 includes multiple display screens 1. In this case, the splicing screen may be in the hemispherical, semi-ellipsoidal, spherical, or ellipsoidal form, to optimize the appearance design of the splicing screen.

Figure 16:
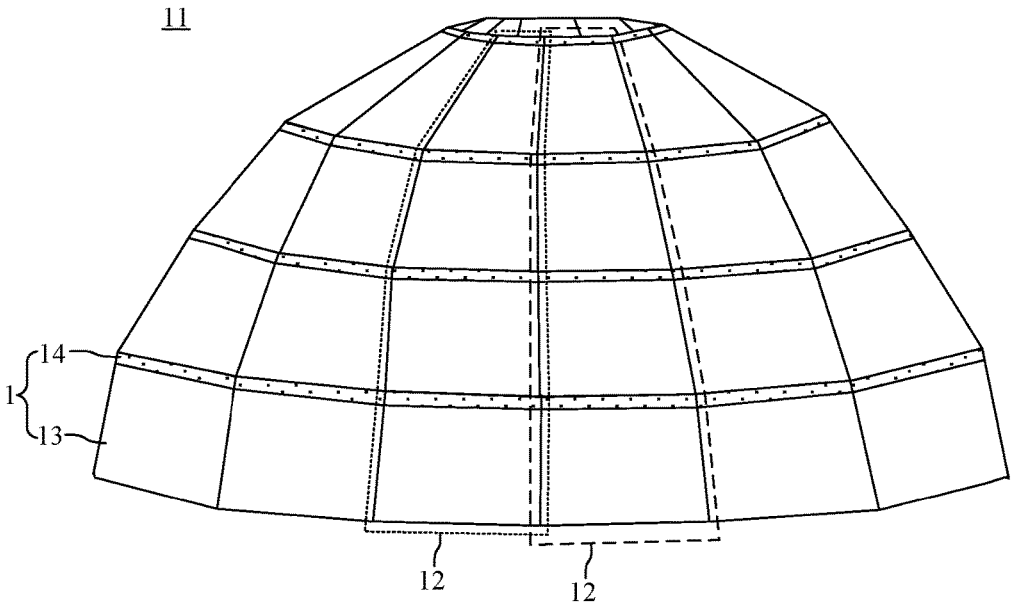
FIG. 16 is a structural schematic diagram of a splicing screen according to another embodiment of the present disclosure.

Further, referring to FIG. 16, FIG. 16 is a structural schematic diagram of a splicing screen according to another embodiment of the present disclosure. The display screen 1 includes a display region 13 and a binding region 14. For two adjacent display screens 1 in the splicing unit 12, the display region 13 of one display screen 1 is adjacent to the binding region 14 of the other display screen 1.

This can avoid that the binding regions 14 of two adjacent display screens 1 in the splicing unit 12 are adjacent to each other, to avoid increasing a width of an invalid region at a splicing position of the two adjacent display screens 1, weaken a splicing gap, and improve the display effect of the splicing screen.

Figure 17:
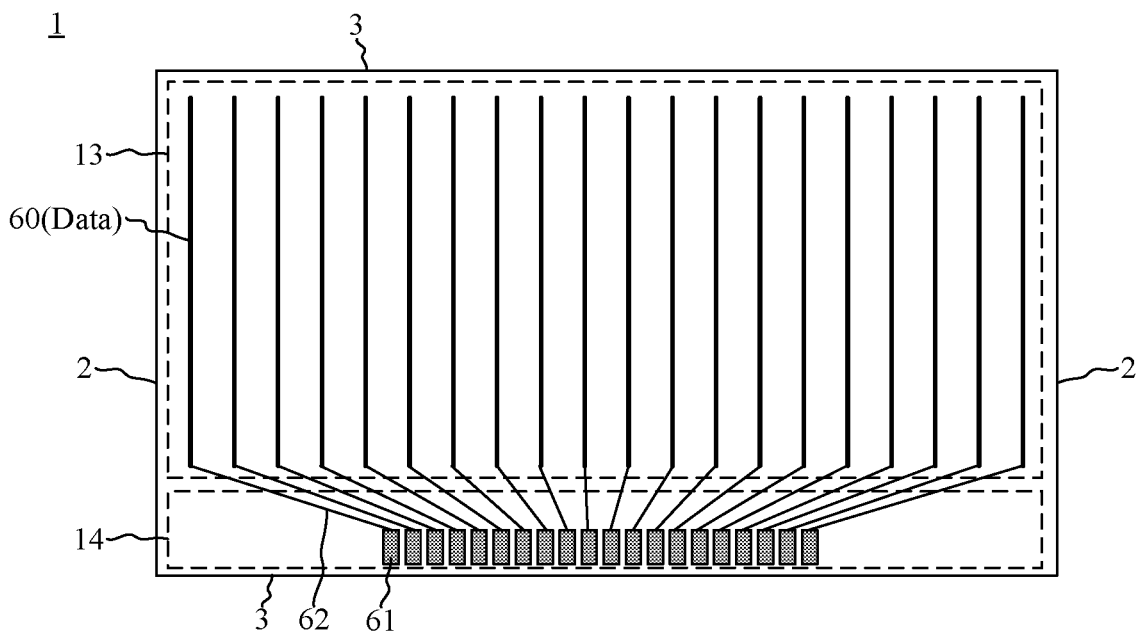
FIG. 17 is a top view of a display screen according to an embodiment of the present disclosure.

Referring to FIG. 17, FIG. 17 is a top view of a display screen 1 according to an embodiment of the present disclosure. The display region 13 includes a first signal line 60. The first signal line 60 may include a signal line for normal operation of a driver circuit (such as a pixel circuit), such as a data line or a power signal line. The data line Data is used as an example in FIG. 17. The binding region 14 includes a pin 61. The pin 61 is connected to the first signal line 60. The pin 61 is configured to transmit a required signal to the first signal line 60. A manner in which the pin 61 is connected to the first signal line 60 shown in FIG. 17 is merely a schematic illustration. In practical application, the first signal line 60 may be directly connected to the pin 61 through a fan-out line 62 shown in FIG. 17. Alternatively, the first signal line 60 may be indirectly connected to the pin 61 through some driver circuits (such as a gating circuit).

Figure 20:
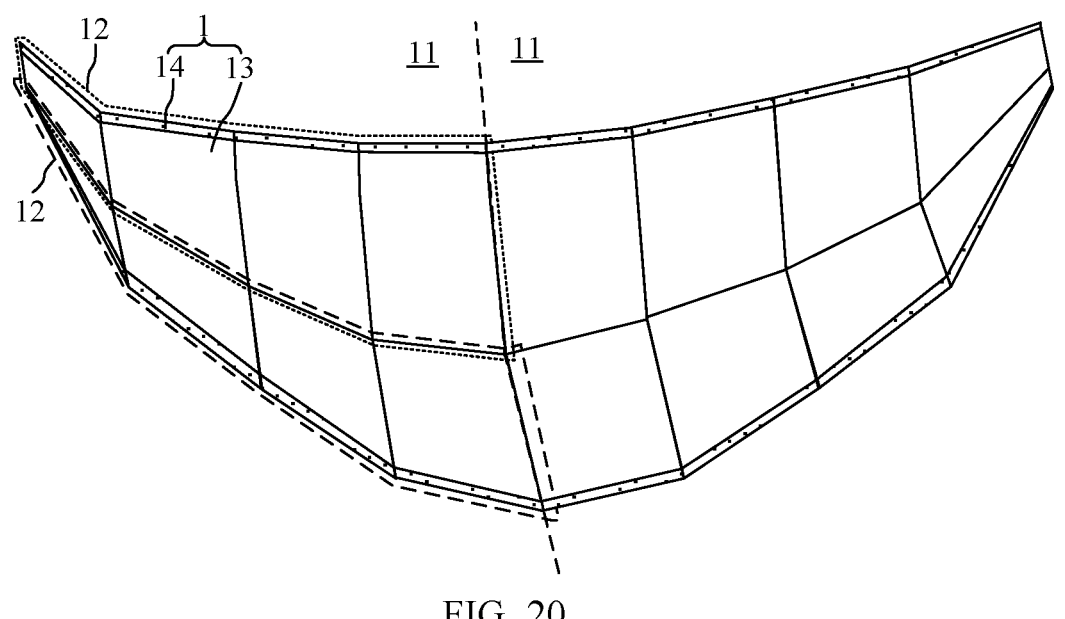
FIG. 20 is a structural schematic diagram of a splicing screen according to another embodiment of the present disclosure.
Figure 23:
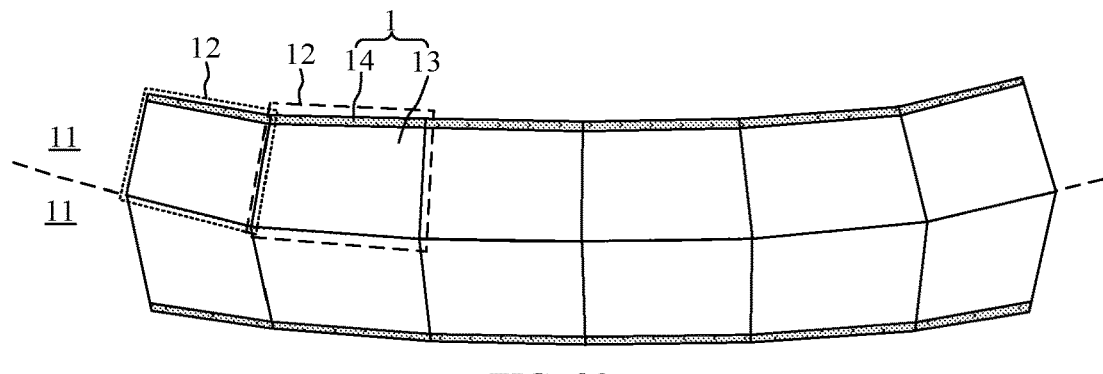
FIG. 23 is a structural schematic diagram of a splicing screen according to another embodiment of the present disclosure.

It should also be noted that the display screen 1 shown in FIG. 16, FIG. 20, and FIG. 23 is divided to only two regions, namely, the display region 13 and the binding region 14, but this is merely intended to more clearly reflect overall design of the binding regions 14 of multiple display screens 1 in the splicing screen. In practical application, referring to FIG. 17, there may be frames between the edge of the display region 13 and the first edge 2 of the display screen 1, and the second edge 3 of the display screen 1 away from the binding region 14. However, it can be understood that because the frame in which the binding region 14 is located needs to accommodate structures such as the pin 61 and the fan-out line 62, the frame in which the binding region 14 is located is much wider than a frame at another side of the display region 13. Therefore, an arrangement manner of the binding regions 14 of multiple display screens 1 in the splicing screen has larger impact on the width of the invalid region in the splicing screen.

Figure 18:
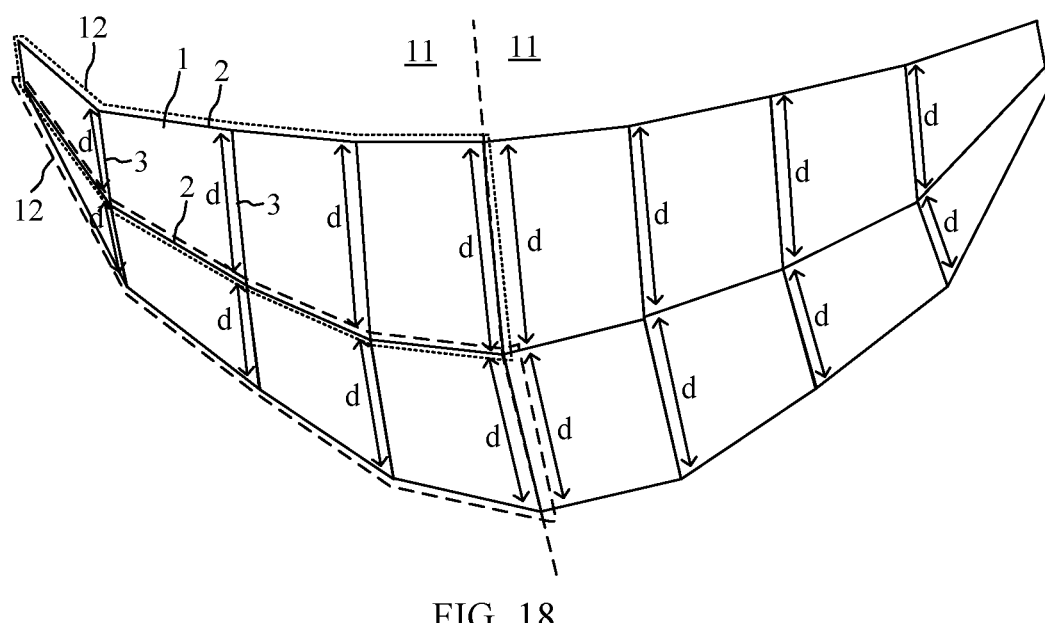
FIG. 18 is a structural schematic diagram of a splicing screen according to another embodiment of the present disclosure.
Figure 19:
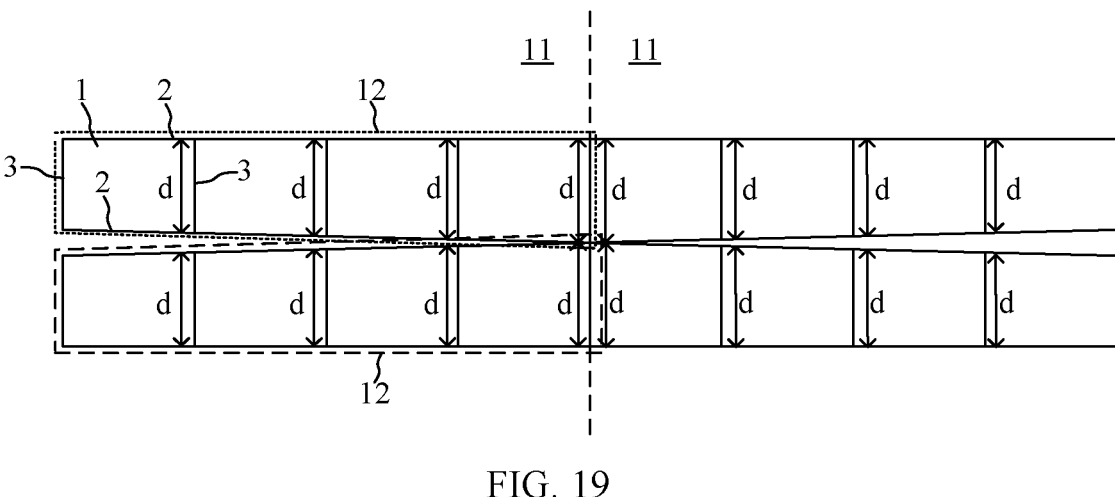
FIG. 19 is a schematic diagram of multiple display screens shown in FIG. 18 in a tiling state.

In an embodiment of the present disclosure, referring to FIG. 18 and FIG. 19, FIG. 18 is a structural schematic diagram of a splicing screen according to another embodiment of the present disclosure, and FIG. 19 is a schematic diagram of multiple display screens 1 shown in FIG. 18 in a tiling state. The splicing sub-screen 11 includes two splicing units 12. The splicing unit 12 includes multiple display screens 1.

For example, the splicing screen includes two splicing sub-screens 11. The first widths d of multiple display screens 1 in the splicing unit 12 gradually decrease in the arrangement direction of the display screens 1. Therefore, as shown in FIG. 19, when the splicing sub-screen 11 includes two splicing units 12 and multiple display screens 1 are in the tiling state, the widths of the two splicing units 12 in the splicing sub-screen 11 gradually change and decrease in a same direction. Further, when the two splicing units 12 are close to each other to be spliced, a formed screen can be in a biaxially bent curved form with narrow ends and wide middle shown in FIG. 18 so that the splicing screen has a design with more flexible and diversified appearance.

Further, referring to FIG. 20, FIG. 20 is a structural schematic diagram of a splicing screen according to another embodiment of the present disclosure. The display screen 1 includes a display region 13 and a binding region 14. A pin or the like connected to a signal line may be disposed in the binding region 14. The display regions 13 of the display screens 1 in two splicing units 12 are adjacent to each other.

In this way, the display regions 13 of the adjacent display screens 1 in the two splicing units 12 are adjacent to each other. This can greatly reduce or even eliminate a width of an invalid region at a splicing position of the two splicing units 12, to effectively weaken a splicing gap and improve the display effect of the splicing screen.

Figure 21:
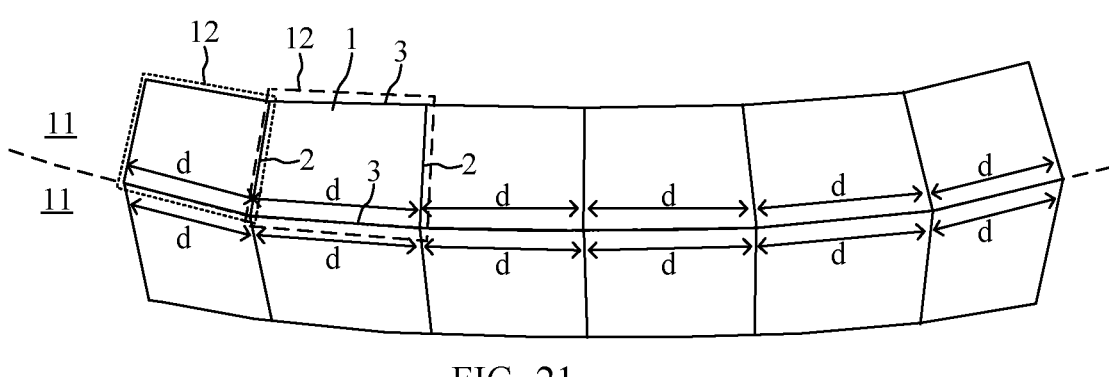
FIG. 21 is a structural schematic diagram of a splicing screen according to another embodiment of the present disclosure.
Figure 22:
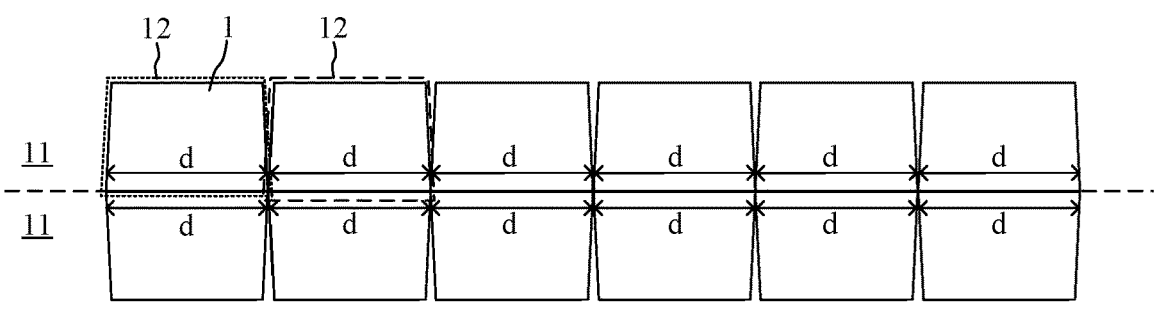
FIG. 22 is a schematic diagram of multiple display screens shown in FIG. 21 in a tiling state.

In an embodiment of the present disclosure, referring to FIG. 21 and FIG. 22, FIG. 21 is a structural schematic diagram of a splicing screen according to another embodiment of the present disclosure, and FIG. 22 is a schematic diagram of multiple display screens 1 shown in FIG. 21 in a tiling state. The splicing screen includes two splicing sub-screens 11. The splicing sub-screen 11 includes multiple splicing units 12. The splicing unit 12 includes one display screen 1.

In this arrangement manner, referring to FIG. 22, when multiple display screens 1 are in the tiling state and the adjacent display screens in the splicing sub-screens 11 are close to each other to be spliced, the splicing screen may be in the biaxial curved form with an equal width shown in FIG. 21. For example, when the splicing screen includes a large number of display screens 1, the splicing screen may alternatively be annular. In this way, the splicing screen has a design with more flexible and diversified appearance.

In addition, in this design, the splicing unit 12 in the splicing sub-screen 11 includes only one display screen 1. Therefore, as shown in FIG. 22, multiple display screens 1 in the splicing sub-screen 11 can be designed to have a same size. This can reduce design difference between different display screens 1, to greatly reduce the design difficulty.

Further, referring to FIG. 23, FIG. 23 is a structural schematic diagram of a splicing screen according to another embodiment of the present disclosure. The display screen 1 includes a display region 13 and a binding region 14. A pin or the like connected to a signal line may be disposed in the binding region 14. The display regions 13 of the display screens 1 in the two splicing sub-screens 11 are adjacent to each other.

In this way, the display regions 13 of the adjacent display screens 1 in the two splicing sub-screens 11 are adjacent to each other. This can greatly reduce or even eliminate a width of an invalid region at a splicing position of the two splicing sub-screens 11, to effectively weaken a splicing gap and improve the display effect of the splicing screen.

In an embodiment of the present disclosure, referring to FIG. 14 and FIG. 15 again, the display screen 1 has a first width d in an arrangement direction of the two first edges 2. The splicing screen includes two splicing sub-screens 11. There is a junction L between the two splicing sub-screens 11. One of the two splicing sub-screens 11 is a first splicing sub-screen 50, and the other is a second splicing sub-screen 51. The first widths d of multiple display screens 1 in a splicing unit 12 in the first splicing sub-screen 50 gradually decrease in a direction from the junction to the first splicing sub-screen 50. The first widths d of multiple display screens 1 in a splicing unit 12 in the second splicing sub-screen 51 gradually decreases in the direction from the junction L to the second splicing sub-screen 51. In this way, the two splicing sub-screens 11 of the splicing screen are symmetrical, an overall shape of the splicing screen is more regular, and the shape design of the splicing screen is optimized.

In addition, in this arrangement manner, size design of multiple display screens 1 in the first splicing sub-screen 50 may be consistent with size design of multiple display screens 1 in the second splicing sub-screen 51. For example, referring to FIG. 15, when multiple display screens 1 are in the tiling state, in the arrangement direction of the display screens 1 in the splicing unit 12, two display screens 1 in the two splicing sub-screens 11 equidistant from the junction may be designed to have a same size, to reduce the design difficulty.

In an embodiment of the present disclosure, referring to FIG. 1 again, in at least one display screen 1, the first edge 2 of the display screen 1 is a straight edge. In this case, the first edges 2 of two display screens 1 can be in closer contact, and no gap exists between the two first edges 2.

When the two second edges 3 of the display screen 1 are parallel, referring to FIG. 19, one first edge 2 may be perpendicular to the second edge 3, and the other first edge 2 may be inclined relative to the second edge 3. Alternatively, referring to FIG. 22, both first edges 2 may be inclined relative to the second edge 3.

Figure 24:
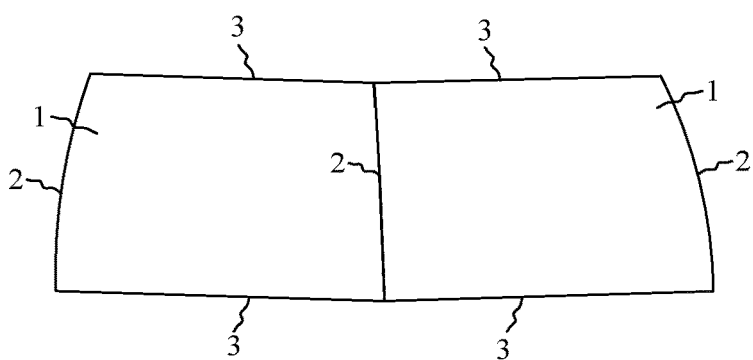
FIG. 24 is a structural schematic diagram of a splicing screen according to another embodiment of the present disclosure.
Figure 25:
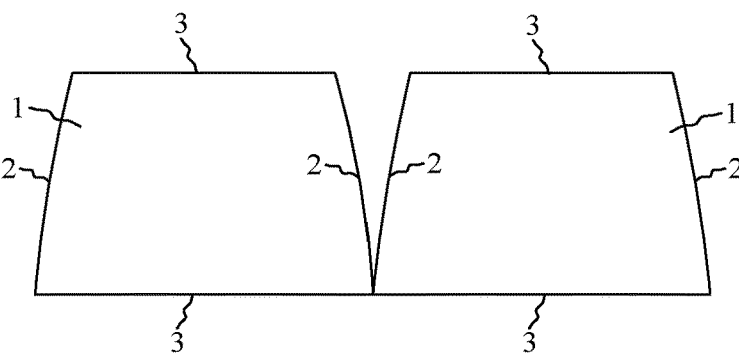
FIG. 25 is a structural schematic diagram of two display screens corresponding to FIG. 24 in a tiling state.

In an embodiment of the present disclosure, referring to FIG. 24 and FIG. 25, FIG. 24 is a structural schematic diagram of a splicing screen according to another embodiment of the present disclosure, and FIG. 25 is a structural schematic diagram of two display screens 1 corresponding to FIG. 24 in a tiling state. In at least one display screen 1, at least one first edge 2 of the display screen 1 is a curved edge so that the splicing screen tends to be in a smooth curved form.

Figure 26:
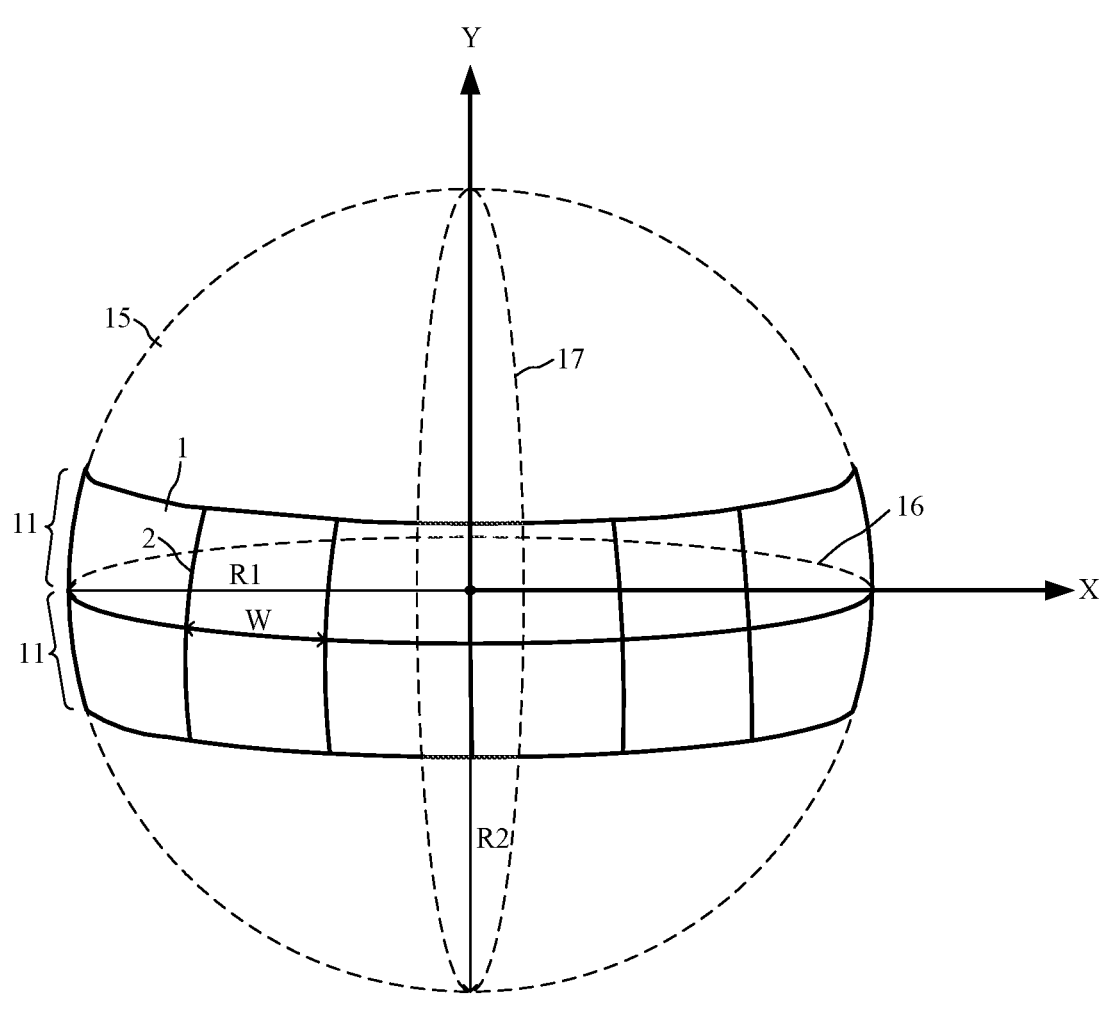
FIG. 26 is a schematic diagram of a virtual coordinate axis according to an embodiment of the present disclosure.

When the first edge 2 of the display screen 1 is a curved edge, in this embodiment of the present disclosure, referring to FIG. 26, FIG. 26 is a schematic diagram of a virtual coordinate axis according to an embodiment of the present disclosure. The first edge 2 of the display screen 1 may satisfy a gradient curve formula in a virtual coordinate system: $X=W\times Y^2/4\times R1\times R2$. The virtual coordinate system takes a circle center of a virtual ellipsoid 15 as a center, a straight line parallel to a maximum transverse section 16 of the virtual ellipsoid 15 as an X axis, and a straight line parallel to a maximum longitudinal section 17 of the virtual ellipsoid 15 as a Y axis. R1 is a maximum radius of the maximum transverse section 16. R2 is a maximum radius of the maximum longitudinal section 17. W is a length of the second edge 3 at which two adjacent display screens 1 in two splicing sub-screens 11 are spliced. When the maximum transverse section 16 and the maximum longitudinal section 17 are circular, the virtual ellipsoid 15 is spherical. In this way, the splicing screen can be more inclined to be in an ideal ellipsoidal or spherical curved form.

In an embodiment of the present disclosure, referring to FIG. 1 and FIG. 2 again, in at least one display screen 1, the two first edges 2 of the display screen 1 are symmetrical so that the display screens 1 in the splicing screen have low design difficulty. For example, for multiple display screens 1 that need to be sequentially spliced at the first edges 2, multiple display screens 1 may be designed to have a same size and shape so that two adjacent display screens 1 can be closely spliced.

In an embodiment of the present disclosure, referring to FIG. 19 again, in at least one display screen 1, one first edge 2 of the display screen 1 is perpendicular to the second edge 3. For example, when the display screen 1 is a flat display screen, a shape of the display screen 1 may be a right-angled trapezoid.

When one first edge 2 of the display screen 1 is perpendicular to the second edge 3, pixels close to the first edge 2 may be aligned at the first edge 2. This can weaken edge serration of the display screen 1.

In an embodiment of the present disclosure, referring to FIG. 1 again, for the two display screens 1 spliced at the first edge 2, the two display screens 1 are symmetrical along the first edge 2 at a splicing position. That is, the two display screens 1 have a same shape and area. A screen formed by splicing the two display screens 1 has better appearance.

Figure 27:
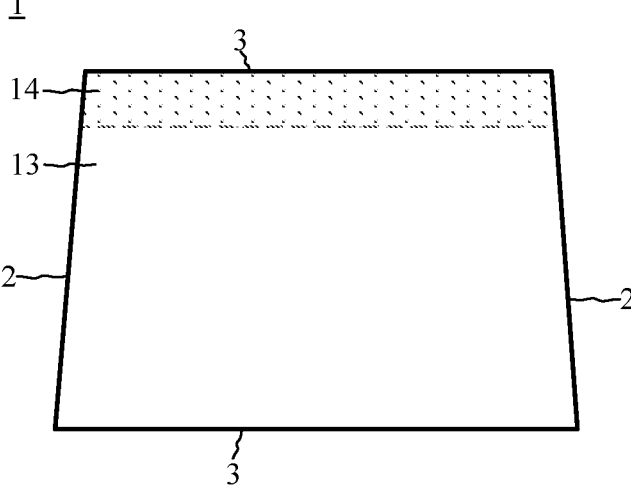
FIG. 27 is a top view of a display screen according to an embodiment of the present disclosure.
Figure 28:
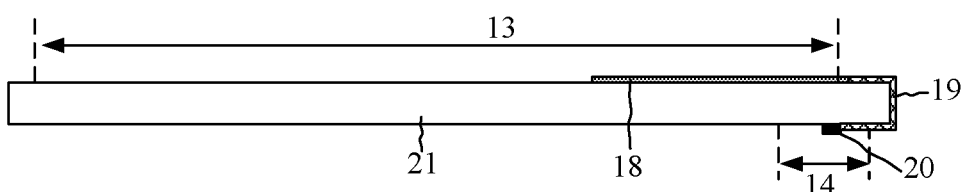
FIG. 28 is a cross-sectional view of a display screen according to an embodiment of the present disclosure.

In an embodiment of the present disclosure, referring to FIG. 27 and FIG. 28, FIG. 27 is a top view of a display screen 1 according to an embodiment of the present disclosure, and FIG. 28 is a cross-sectional view of a display screen 1 according to an embodiment of the present disclosure. The display screen 1 includes a display region 13 and a binding region 14. The binding region 14 is located at a backlight side of the display screen 1. A wiring 18 in the display region 13 is electrically connected to a pin 20 in the binding region 14 through a connection line 19. The connection line 19 extends from a light exit side of the display screen 1 to the backlight side of the display screen 1. Referring to FIG. 28, the connection line 19 extends from the light exit side of the display screen 1 to a side wall of the display screen 1 and then to the backlight side of the display screen 1.

In this design, the binding region 14 of the display screen 1 does not occupy front space of the display screen 1. In a direction of being opposite to the display screen 1, only the display region 13 can be viewed but the binding region 14 cannot be viewed so that the display screen 1 can be designed without a frame on a front side. Therefore, when multiple display screens 1 are spliced together, a width of an invalid region at a splicing position of the display screens 1 can be further reduced so that a splicing effect tends to be ideal seamless splicing.

Figure 29:
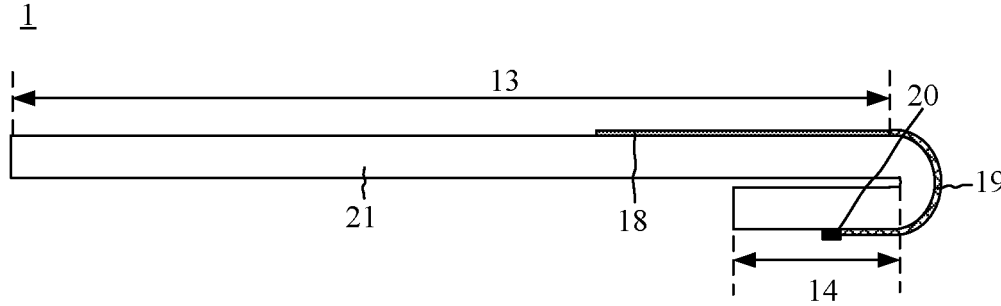
FIG. 29 is a cross-sectional view of a display screen according to another embodiment of the present disclosure.

The first edge 2 and the second edge 3 in this embodiment of the present disclosure are both edges of a portion of the display screen 1 exposed at the light exit side. Referring to FIG. 27, when the binding region 14 is disposed at the backlight side of the display screen 1, referring to FIG. 28, if a substrate 21 is not bent, the first edge 2 and the second edge 3 are outer edges of the display screen 1. However, referring to FIG. 29, FIG. 29 is a cross-sectional view of a display screen 1 according to another embodiment of the present disclosure. If the binding region 14 is disposed at the backlight side of the display screen 1 by bending the substrate 21, the first edge 2 and the second edge 3 of the display screen 1 are not the outer edges of the display screen 1.

Figure 30:
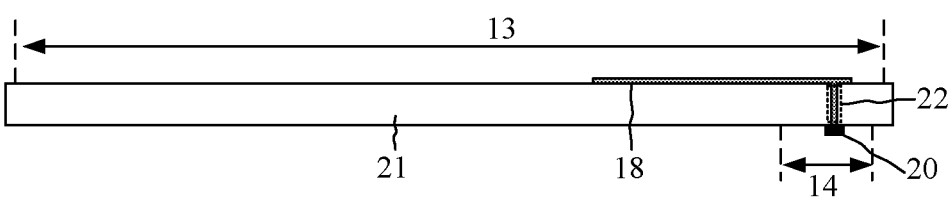
FIG. 30 is a cross-sectional view of a display screen according to another embodiment of the present disclosure.

In an embodiment of the present disclosure, referring to FIG. 27 and FIG. 30, FIG. 30 is a cross-sectional view of a display screen 1 according to another embodiment of the present disclosure. The display screen 1 includes a display region 13 and a binding region 14. The binding region 14 is located at a backlight side of the display screen 1. The display screen 1 includes a substrate 21. A wiring 18 in the display region 13 is electrically connected to a pin 20 in the binding region 14 through a via hole 22 penetrating through the substrate 21.

Similar to the foregoing design, in this design, the binding region 14 also does not occupy the front space of the display screen 1. Therefore, the width of the invalid region of the display screen 1 at the splicing position can be further reduced so that the splicing effect tends to be ideal seamless splicing. In addition, in this arrangement manner, the wiring 18 in the display region 13 is directly electrically connected to the pin 20 in the binding region 14 through the via hole 22 penetrating through the substrate 21. The wiring 18 does not need to be connected to the pin 20 in the binding region 14 through the connection line 19 bent to the backlight side of the display screen 1. This can avoid a risk of disconnection caused by bending and fracture of the connection line 19. The connection between the wiring 18 and the pin 20 has higher reliability.

Figure 31:
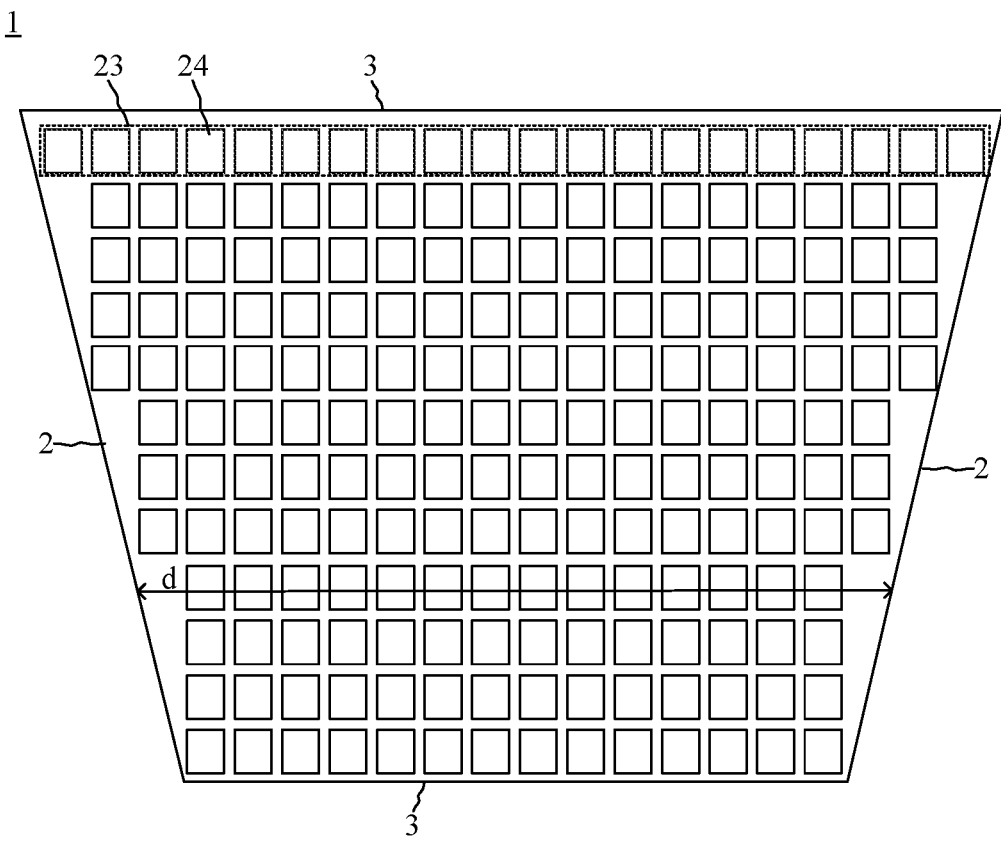
FIG. 31 is a structural schematic diagram of a display screen according to an embodiment of the present disclosure.

Referring to FIG. 31, FIG. 31 is a structural schematic diagram of a display screen 1 according to an embodiment of the present disclosure. It can be understood that to enable the display screen 1 to implement normal display, the display screen 1 includes multiple pixel rows 23. The pixel row includes multiple pixels 24. An arrangement direction of multiple pixel rows 23 intersects the arrangement direction of the two first edges 2. An arrangement direction of multiple pixels 24 in the pixel row 23 is parallel to the arrangement direction of the two first edges 2.

In this embodiment of the present disclosure, the two opposite first edges 2 of the display screen 1 are not parallel to each other. At least one first edge 2 is inclined relative to one second edge 3. For example, the first width d of the display screen 1 gradually changes. A smaller first width d indicates that fewer pixels can be accommodated in the pixel row 23. In an arrangement manner, referring to FIG. 31, pixels 24 with insufficient positions may be directly removed from the pixel row 23 to adapt to the inclination design of the first edge 2.

However, in a research process, the inventor found that directly removing the pixels 24 causes a large difference between widths of blank regions between outermost pixels 24 in different pixel rows 23 and the first edge 2, resulting in an obvious jagged step close to the first edge 2, and further causing obvious edge serration of the display screen 1. In particular, when two display screens 1 are spliced at the first edge 2, a total width of a blank region at a splicing position is large, and impact on splicing display is more obvious.

In view of this, in this embodiment of the present disclosure, pixel design in the display screen 1 is further adjusted to effectively resolve edge serration of the display screen 1, and further optimize the display effect of the splicing screen.

Figure 32:
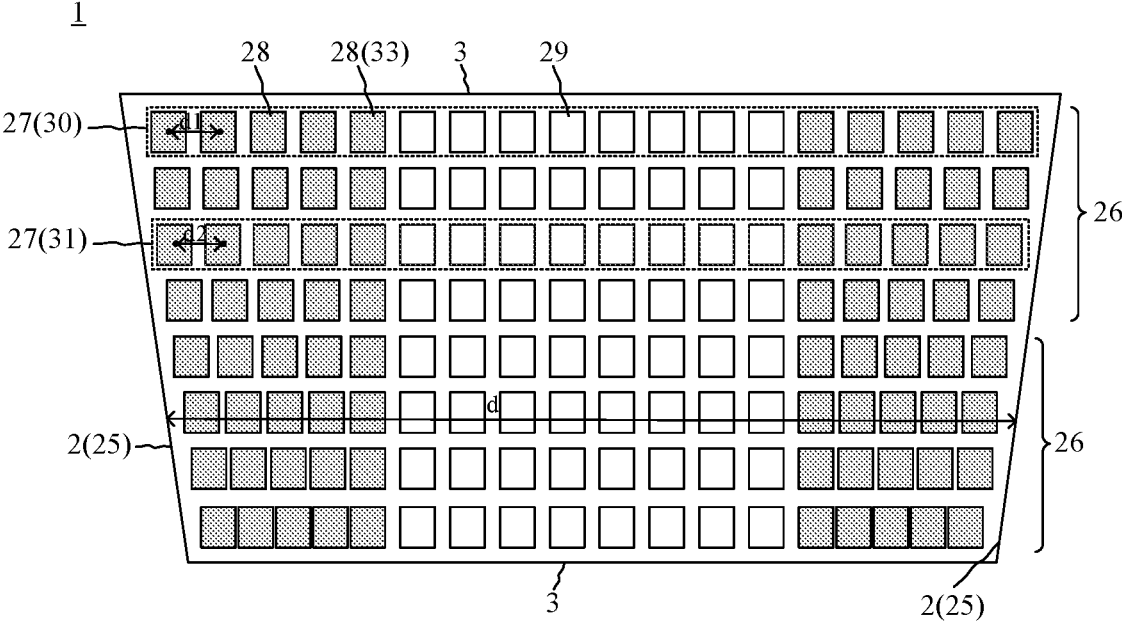
FIG. 32 is another structural schematic diagram of a display screen according to an embodiment of the present disclosure.

In an embodiment of the present disclosure, referring to FIG. 32, FIG. 32 is another structural schematic diagram of a display screen 1 according to an embodiment of the present disclosure. The two opposite first edges 2 of the display screen 1 include a third sub-edge 25. The third sub-edge 25 is not perpendicular to the second edge 3.

The display screen 1 includes a pixel group 26. The pixel group 26 includes at least two first pixel rows 27. The at least two first pixel rows 27 are arranged in an arrangement direction of the two second edges 3. The first pixel row 27 includes a second-type pixel 29 and at least two first-type pixels 28. The first-type pixel 28 is located between the third sub-edge 25 and the second-type pixel 29.

The display screen 1 has a first width d in an arrangement direction of the first edges 2. The first pixel rows 27 in the pixel group 26 include a first pixel sub-row 30 and a second pixel sub-row 31. The first width d of the display screen 1 at a position of the first pixel sub-row 30 is greater than the first width d at a position of the second pixel sub-row 31. A distance d2 between geometric center points of the first-type pixels 28 in the second pixel sub-row 31 is smaller than a distance d1 between geometric center points of the first-type pixels 28 in the first pixel sub-row 30.

In this arrangement manner, when the first width d of the display screen 1 at the position of the second pixel sub-row 31 is small, the distance between the geometric center points of the first-type pixels 28 in the second pixel sub-row 31 may be reduced to reduce an overall width occupied by the second pixel sub-row 31 in the arrangement direction of the first edges 2 so that the overall width of the second pixel sub-row 31 matches the first width d at the position.

In comparison with the manner of directly removing the outermost pixels shown in FIG. 31, in this arrangement manner, a width of a blank region between an outermost first-type pixel 28 in each first pixel row 27 and the third sub-edge 25 is similar and small. This avoids forming an obvious step at the third sub-edge 25 and effectively weakens edge serration of the display screen 1.

In addition, when the width of the blank region between the outermost first-type pixel 28 in each first pixel row 27 and the third sub-edge 25 is small and two display screens 1 are spliced at the third sub-edge 25, a width of a blank region between two first pixel rows 27 opposite to each other in the two display screens 1 is also small. This can further reduce an area of an invalid region at a splicing position of the two display screens 1 and improve a splicing display effect.

Figure 38:
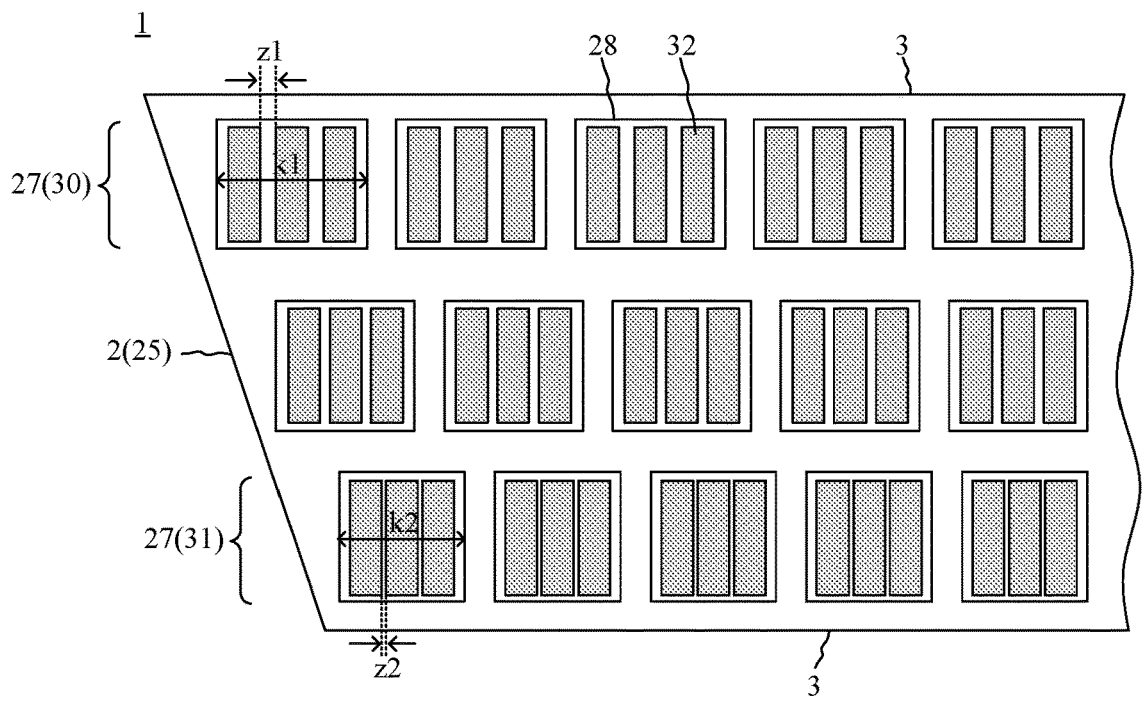
FIG. 38 is a partial structural schematic diagram of a display screen according to another embodiment of the present disclosure.

The first-type pixel 28, the second-type pixel 29, and the like in this embodiment of the present disclosure may be minimum light-emitting units configured to emit white light in the display screen 1. Referring to FIG. 38, a pixel may include multiple sub-pixels configured to emit light of different colors, for example, may include a red sub-pixel, a green sub-pixel, and a blue sub-pixel, or may include a red sub-pixel, a green sub-pixel, a blue sub-pixel, and a white sub-pixel. In addition, a number of sub-pixels included in the pixel is not limited. For example, the pixel may include one red sub-pixel, one green sub-pixel, and one blue sub-pixel, or may include one red sub-pixel, one green sub-pixel, and multiple blue sub-pixels.

Figure 33:
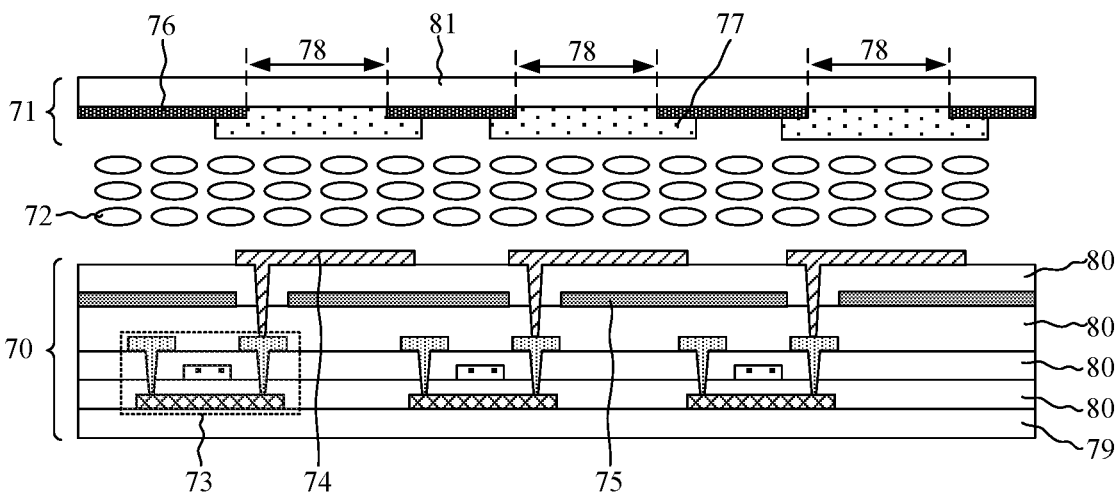
FIG. 33 is a cross-sectional view of a display screen according to another embodiment of the present disclosure.

The display screen 1 in the embodiments of the present disclosure may be a liquid crystal display (LCD) screen. Referring to FIG. 33, FIG. 33 is a cross-sectional view of a display screen 1 according to another embodiment of the present disclosure. The LCD screen includes an array substrate 70 and a color filter substrate 71 opposite to each other, and a liquid crystal 72 located between the array substrate 70 and the color filter substrate 71. The array substrate 70 may include a driver circuit 73, a pixel electrode 74, and a common electrode 75. The color filter substrate 71 includes a black matrix 76 and a color resistance 77. The black matrix 76 has a first opening 78. The first opening 78 is used to define a light-emitting region of the LCD screen. In addition, the array substrate 71 may further include a first substrate 79 and multiple first insulation layers 80. The color filter substrate 71 may further include a second substrate 81. Details are not described herein.

When the display screen 1 is an LCD screen, the foregoing sub-pixel may be regarded as the first opening 78 of the black matrix 76. Shapes and areas of the sub-pixel and pixel are related to design of the first opening 78. For example, a shape of the first opening 78 may be adjusted to adjust the shape of the sub-pixel so that the shape of the pixel can be adjusted.

Figure 34:
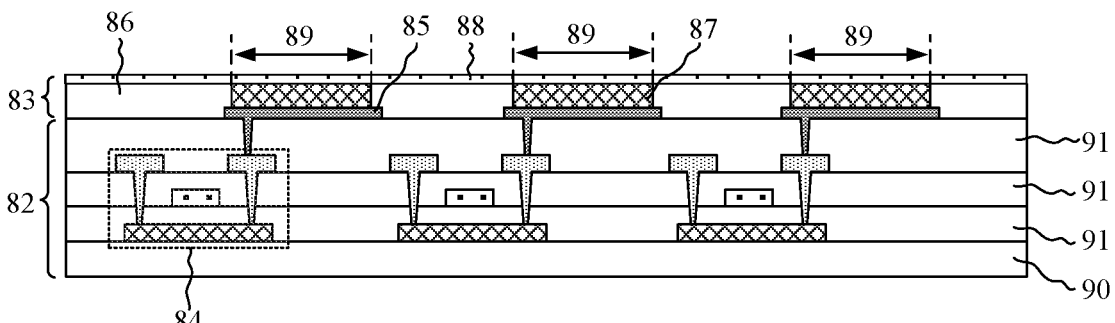
FIG. 34 is a cross-sectional view of a display screen according to another embodiment of the present disclosure.

Alternatively, the display screen 1 in the embodiments of the present disclosure may be an organic light-emitting diode (OLED) display screen. Referring to FIG. 34, FIG. 34 is a cross-sectional view of a display screen 1 according to another embodiment of the present disclosure. The OLED display screen includes a circuit device layer 82 and a light-emitting device layer 83. The circuit device layer 82 includes a pixel circuit 84. The light-emitting device layer 83 includes an anode layer 85, a pixel definition layer 86, a light-emitting layer 87, and a cathode layer 88. The pixel definition layer 86 includes a second opening 89. The second opening 89 exposes at least a part of the anode layer 85. The second opening 89 is used to define a light-emitting region of the OLED display screen. In addition, the circuit device layer 82 may further include a third substrate 90 and multiple second insulation layers 91. Details are not described herein.

When the display screen 1 is an OLED display screen, the sub-pixel in this embodiment of the present disclosure may be regarded as the second opening 89 of the pixel definition layer 86. Shapes and areas of the sub-pixel and pixel are related to design of the second opening 89. For example, shape of the second opening 89 may be adjusted to adjust the shape of the sub-pixel so that the shape of the pixel can be adjusted.

Figure 35:
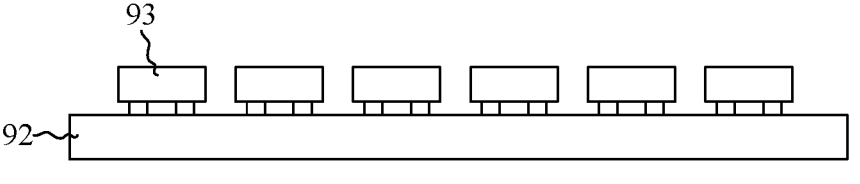
FIG. 35 is a cross-sectional view of a display screen according to another embodiment of the present disclosure.

Alternatively, the display screen 1 in the embodiments of the present disclosure may be a light-emitting diode (LED) display screen. Referring to FIG. 35, FIG. 35 is a cross-sectional view of a display screen 1 according to another embodiment of the present disclosure. The LED display screen includes a drive substrate 92 and an LED 93 bonded to the drive substrate 92.

When the display screen 1 is an LED display screen, the sub-pixel in this embodiment of the present disclosure may be regarded as the LED 93. Shapes and areas of the sub-pixel and pixel are related to the design of the LED 93. For example, the shape of the sub-pixel may be adjusted through an LED 93 with a different shape so that the shape of the pixel can be adjusted.

In addition, in this embodiment of the present disclosure, the pixel may have a regular shape, such as a polygon, a near polygon, a circle, or a quasi-circle. When the shape of the pixel is a polygon or a near polygon, the geometric center point of the pixel is an intersection of diagonal lines. When the shape of the pixel is a circle or a quasi-circle, the geometric center point of the pixel is a circle center.

In an embodiment of the present disclosure, referring to FIG. 32 again, the first width d of the display screen 1 gradually decreases. A distance between geometric center points of the first-type pixels 28 in multiple first pixel rows 27 in the pixel group 26 gradually decreases in a direction in which the first width d gradually decreases.

In other words, a smaller first width d indicates a smaller distance between the geometric center points of the first-type pixels 28 in the first pixel row 27 and a smaller overall width occupied by the first-type pixels 28 in the arrangement direction of the two first edges 2, and that the width of the first pixel row 27 is more matched with an inclination direction of the third sub-edge 25. In addition, the distance between the geometric center points of the first-type pixels 28 in multiple first pixel rows 27 in the pixel group 26 is designed to gradually decrease. This can make the arrangement of the first-type pixels 28 in multiple first pixel rows 27 change more evenly and gently, and optimize a display effect in a region in which the first-type pixels 28 are located.

Figure 36:
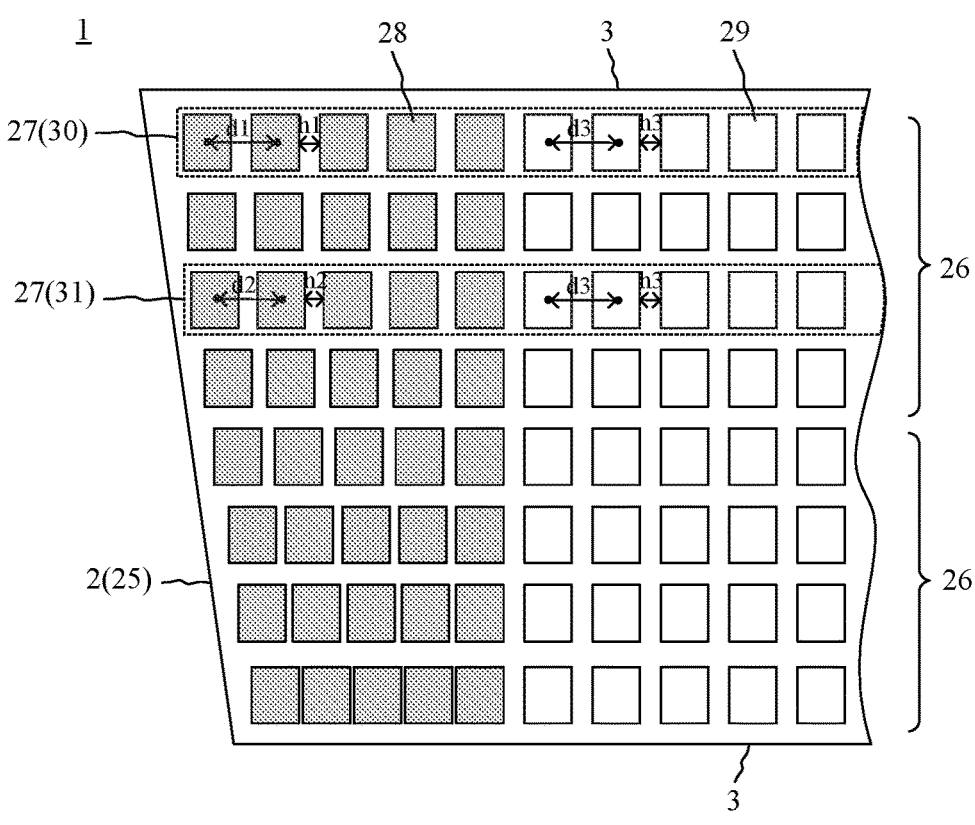
FIG. 36 is a partial structural schematic diagram of a display screen according to an embodiment of the present disclosure.

In an embodiment of the present disclosure, referring to FIG. 36, FIG. 36 is a partial structural schematic diagram of a display screen 1 according to an embodiment of the present disclosure. In the first pixel sub-row 30, the distance d1 between the geometric center points of the first-type pixels 28 is smaller than or equal to a distance d3 between geometric center points of the second-type pixels 29. In the second pixel sub-row 31, the distance d2 between the geometric center points of the first-type pixels 28 is smaller than a distance d3 between geometric center points of the second-type pixels 29.

For example, when the first pixel sub-row 30 is the first pixel row 27 closest to the second edge 3 and the first width d of the display screen 1 at the position of the first pixel sub-row 30 is the largest, the distance d1 between the geometric center points of the first-type pixels 28 in the first pixel sub-row 30 may be equal to the distance d3 between the geometric center points of the second-type pixels 29. In this case, the distance between the geometric center points of any two adjacent pixels in the first pixel sub-row 30 is equal.

When there is another first pixel row 27 between the first pixel sub-row 30 and the second edge 3, the distance d1 between the geometric center points of the first-type pixels 28 in the first pixel sub-row 30 may be smaller than the distance d3 between the geometric center points of the second-type pixels 29. This reduces the overall width of the first pixel sub-row 30 in the arrangement direction of the two first edges 2, to better match the inclination direction of the third sub-edge 25.

In an embodiment of the present disclosure, referring to FIG. 36 again, a distance h2 between adjacent first-type pixels 28 in the second pixel sub-row 31 is smaller than a distance h1 between adjacent first-type pixels 28 in the first pixel sub-row 30.

In this arrangement manner, the distance between the adjacent first-type pixels 28 in the second pixel sub-row 31 is reduced to reduce the distance between the geometric center points of the adjacent first-type pixels 28. In this way, the size of the first-type pixel 28 is kept consistent with the size of the second-type pixel 29 without adjusting the size of a single first-type pixel 28, to avoid affecting the light-emitting region of the first-type pixel 28 and ensure that a single first-type pixel 28 still has high display brightness.

In this embodiment of the present disclosure, when the distance h2 between the adjacent first-type pixels 28 in the second pixel sub-row 31 is smaller than the distance h1 between the adjacent first-type pixels 28 in the first pixel sub-row 30, referring to FIG. 36 again, in the first pixel sub-row 30, the distance h1 between the adjacent first-type pixels 28 may be smaller than or equal to a distance h3 between adjacent second-type pixels 29. In the second pixel sub-row 31, the distance h2 between the adjacent first-type pixels 28 is smaller than a distance h3 between adjacent second-type pixels 29.

Figure 37:
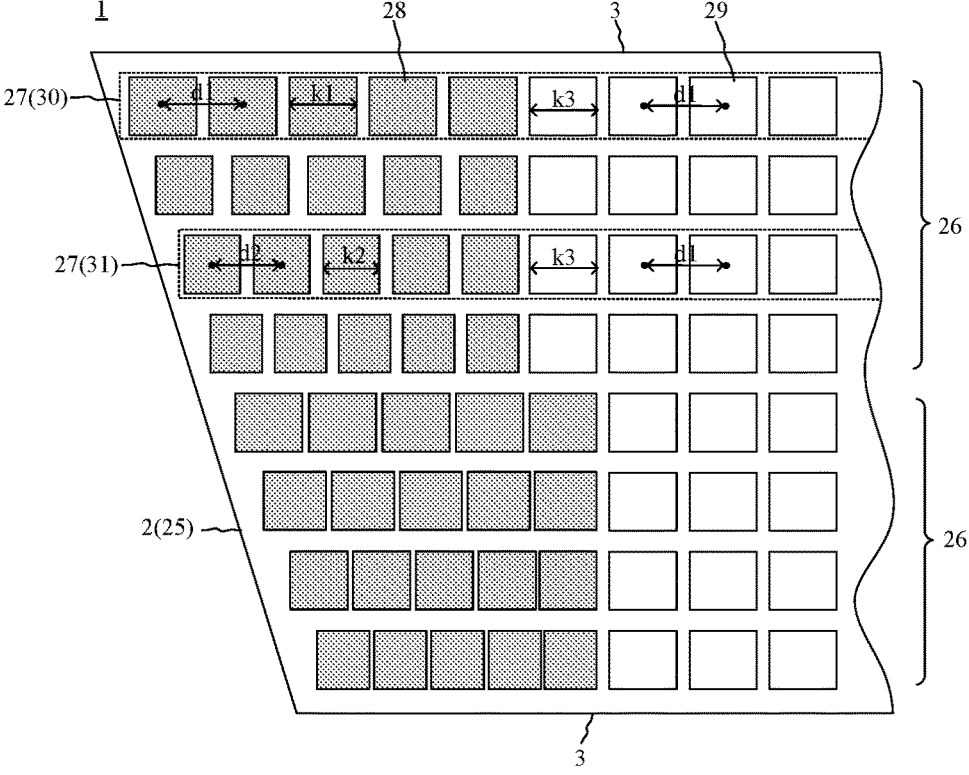
FIG. 37 is a partial structural schematic diagram of a display screen according to another embodiment of the present disclosure.

In an embodiment of the present disclosure, referring to FIG. 37, FIG. 37 is a partial structural schematic diagram of a display screen 1 according to another embodiment of the present disclosure. The first-type pixel 28 has a second width in the arrangement direction of the two first edges 2. The second width k2 of the first-type pixel 28 in the second pixel sub-row 31 is smaller than the second width k1 of the first-type pixel 28 in the first pixel sub-row 30 so that the distance between the geometric center points of the adjacent first-type pixels 28 in the second pixel sub-row 31 is smaller than the distance between the geometric center points of the adjacent first-type pixels 28 in the first pixel sub-row 30.

In this embodiment of the present disclosure, when the second width k2 of the first-type pixel 28 in the second pixel sub-row 31 is smaller than the second width k1 of the first-type pixel 28 in the first pixel sub-row 30, in the first pixel sub-row 30, the second width k1 of the first-type pixel 28 may be smaller than or equal to the second width k3 of the second-type pixel 29. In the second pixel sub-row 31, the second width k2 of the first-type pixel 28 may be smaller than the second width k3 of the second-type pixel 29.

Further, referring to FIG. 38, FIG. 38 is a partial structural schematic diagram of a display screen 1 according to another embodiment of the present disclosure. The first-type pixel 28 includes multiple sub-pixels 32. Multiple sub-pixels 32 are arranged in the arrangement direction of the two first edges 2. In this embodiment of the present disclosure, the first-type pixel 28 may include a red sub-pixel configured to emit red light, a green sub-pixel configured to emit green light, and a blue sub-pixel configured to emit blue light. A distance z2 between the sub-pixels 32 of the first-type pixel 28 in the second pixel sub-row 31 is smaller than a distance z1 between the sub-pixels 32 of the first-type pixel 28 in the first pixel sub-row 30, to reduce the second width k2 of the first-type pixel 28 in the second pixel sub-row 31.

In addition, in this arrangement manner, the distance between the sub-pixels 32 of the first-type pixel 28 in the second pixel sub-row 31 is reduced to reduce the second width k2 of the first-type pixel 28. In this way, the size of the sub-pixel 32 in the first-type pixel 28 is still consistent with the size of the sub-pixel 32 of a same light-emitting color in the second-type pixel 29 without changing the size of a single sub-pixel 32 in the first-type pixel 28, to avoid affecting the light-emitting region of the first-type pixel 28 and ensure that a single first-type pixel 28 still has high display brightness.

In an embodiment of the present disclosure, referring to FIG. 32 again, first pixels 33 of multiple first pixel rows 27 in the pixel group 26 are aligned. The first pixel 33 is the first-type pixel 28 closest to the second-type pixel 29 in the first pixel row 27. In this way, the arrangement of the second-type pixels 29 in the first pixel rows 27 is not affected by the arrangement of the first-type pixels 28, and the second-type pixels 29 in the first pixel rows 27 are aligned.

Figure 39:
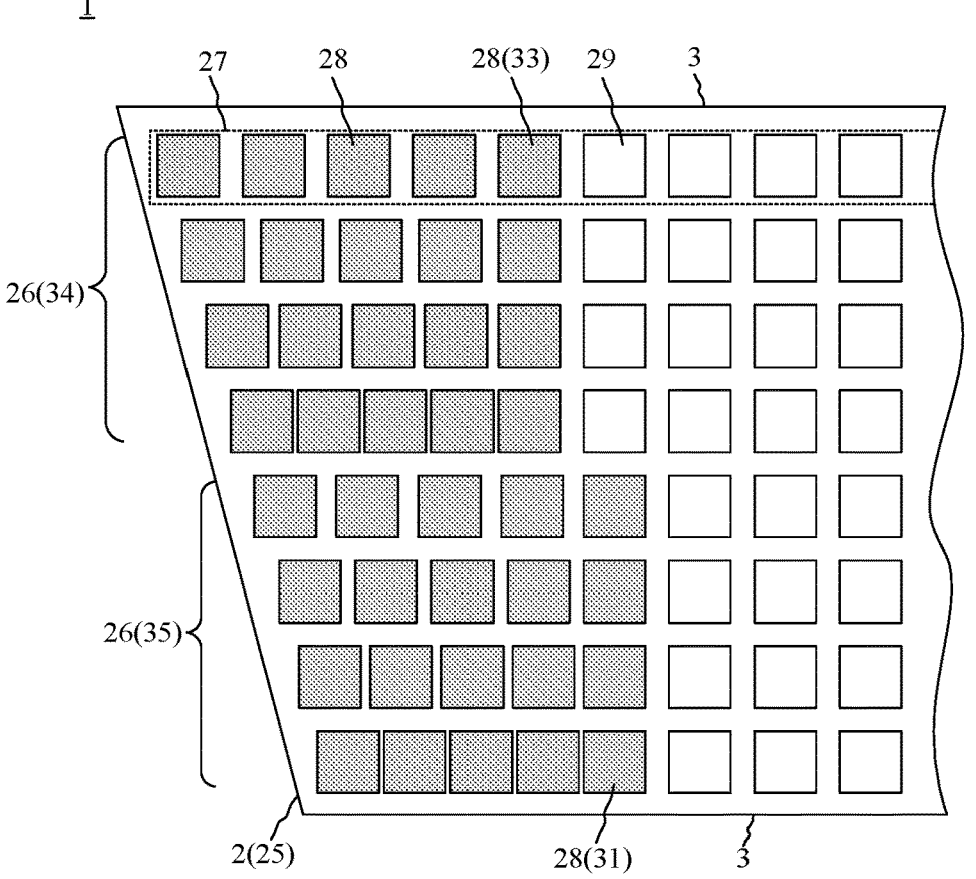
FIG. 39 is a partial structural schematic diagram of a display screen according to another embodiment of the present disclosure.

In an embodiment of the present disclosure, referring to FIG. 39, FIG. 39 is a partial structural schematic diagram of a display screen 1 according to another embodiment of the present disclosure. The pixel group 26 includes a first pixel group 34 and a second pixel group 35. The first width of the display screen 1 at a position of the first pixel group 34 is greater than the first width at a position of the second pixel group 35.

A number of the first-type pixels 28 included in the first pixel row 27 in the first pixel group 34 is equal to a number of the first-type pixels 28 included in the first pixel row 27 in the second pixel group 35. A first pixel 33 in the first pixel row 27 in the second pixel group 35 is aligned with the second-type pixel 29 in the first pixel row 27 in the first pixel group 34. The first pixel 33 is the first-type pixel 28 closest to the second-type pixel 29 in the first pixel row 27.

Because the first width of the display screen 1 at the position of the second pixel group 35 is small, when the number of the first-type pixels 28 included in the first pixel row 27 in the second pixel group 35 is equal to the number of the first-type pixels 28 included in the first pixel row 27 in the first pixel group 34, if the first pixel 33 in the first pixel row 27 in the second pixel group 35 is aligned with the first pixel 33 in the first pixel row 27 in the first pixel group 34, there may be insufficient space in the first pixel row 27 in the second pixel group 35 to accommodate all first-type pixels 28. Therefore, in this embodiment of the present disclosure, the first pixel 33 in the first pixel row 27 in the second pixel group 35 is aligned with the second-type pixel 29 in the first pixel row 27 in the first pixel group 34 so that larger space can be provided for the first-type pixel 28 at a position close to the third sub-edge 25. This helps optimize the arrangement of the first-type pixels 28 in the second pixel group 35.

Figure 40:
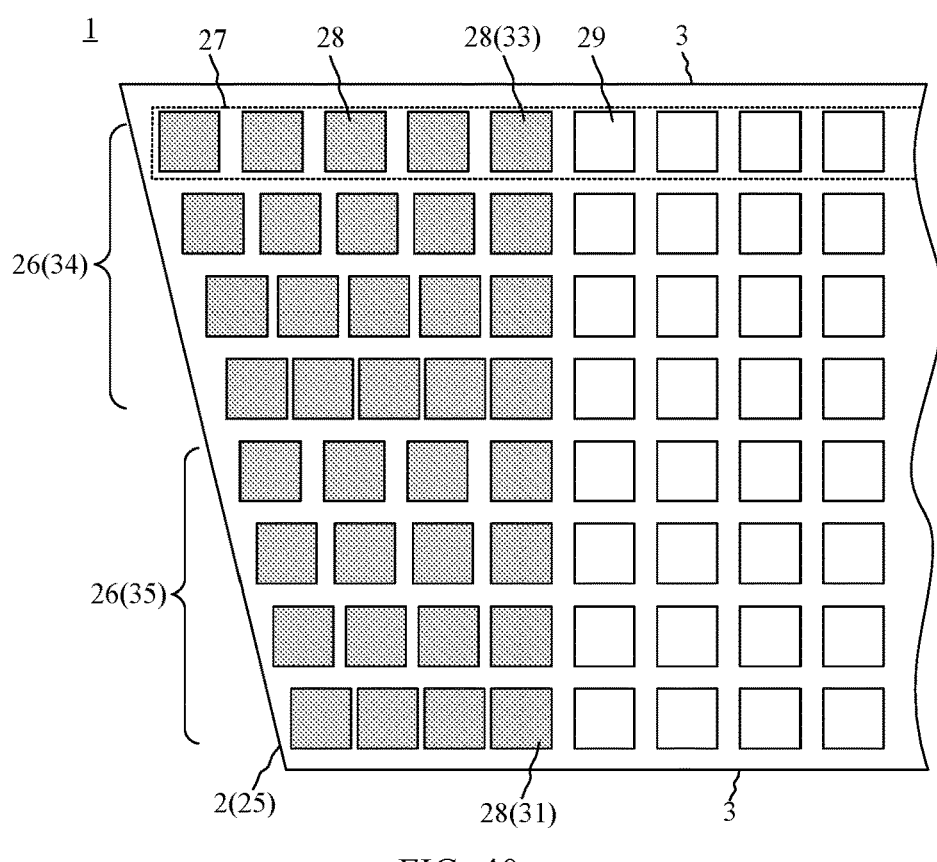
FIG. 40 is a partial structural schematic diagram of a display screen according to another embodiment of the present disclosure.

In an embodiment of the present disclosure, referring to FIG. 40, FIG. 40 is a partial structural schematic diagram of a display screen 1 according to another embodiment of the present disclosure. The pixel group 26 includes a first pixel group 34 and a second pixel group 35. The first width of the display screen 1 at a position of the first pixel group 34 is greater than the first width at a position of the second pixel group 35.

A number of the first-type pixels 28 included in the first pixel row 27 in the first pixel group 34 is greater than a number of the first-type pixels 28 included in the first pixel row 27 in the second pixel group 35. A first pixel 33 in the first pixel row 27 in the first pixel group 34 is aligned with a first pixel 33 in the first pixel row 27 in the second pixel group 35. The first pixel 33 is the first-type pixel 28 closest to the second-type pixel 29 in the first pixel row 27.

Since the first width of the display screen 1 at the position of the second pixel group is small, the number of the first-type pixels 28 included in the first pixel row 27 in the second pixel group 35 may be set to be smaller, so that larger adjustment space can be provided for the distance between the geometric center points of the first-type pixels 28 in the first pixel row 27 in the second pixel group 35.

In an embodiment of the present disclosure, referring to FIG. 40 again, a number of first-type pixels 28 at a same side of the second-type pixels 29 in the first pixel row 27 is greater than or equal to 5.

If the number of the first-type pixels 28 in the first pixel row 27 is set to be too small, a degree of adjustment of the distance between the geometric center points of the first-type pixels 28 is limited. Therefore, in this embodiment of the present disclosure, the number of the first-type pixels 28 at the same side of the second-type pixels 29 in the first pixel row 27 is set to be greater than or equal to 5 so that the adjustment of the overall width occupied by the first-type pixels 28 can be more flexible.

Figure 41:
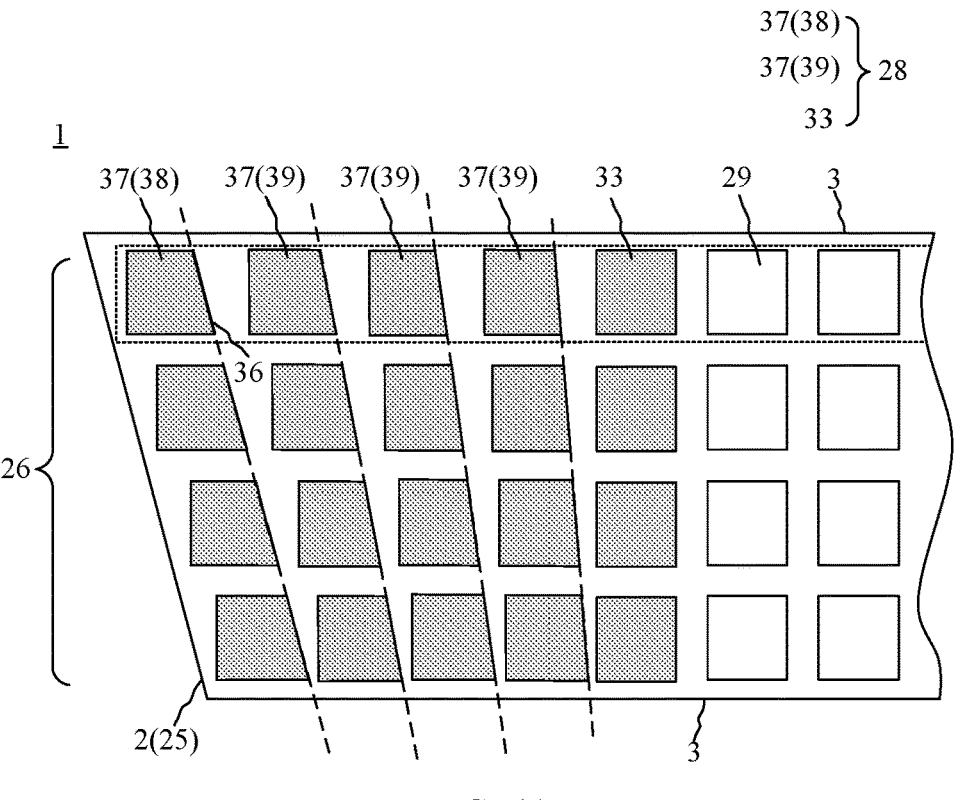
FIG. 41 is a partial structural schematic diagram of a display screen according to another embodiment of the present disclosure.

In an embodiment of the present disclosure, referring to FIG. 41, FIG. 41 is a partial structural schematic diagram of a display screen 1 according to another embodiment of the present disclosure. The first-type pixel 28 includes a first pixel edge 36. The first pixel edge 36 is located at a side close to the second-type pixel 29. The first-type pixels 28 in the first pixel row 27 include a first pixel 33 and a second pixel 37. The first pixel 33 is the first-type pixel 28 closest to the second-type pixel 29. The second pixel 37 is located between the first pixel 33 and the third sub-edge 25. The first width d of the display screen 1 gradually decreases. The first pixel edge 36 of the second pixel 37 is inclined toward a direction close to the second-type pixel 29 in a direction in which the first width d gradually decreases.

After the distance between the geometric center points of the first-type pixels 28 in the first pixel rows 27 is adjusted, the first-type pixels 28 in multiple first pixel rows 27 are arranged in a non-aligned manner. Designing the first pixel edge 36 of the second pixel 37 to be inclined can weaken a step between the first pixel edges 36 of the second pixels 37 in multiple first pixel rows 27, so that serration formed by the first-type pixels 28 is further weakened.

As described above, when the display screen 1 in the embodiments of the present disclosure is an LCD screen, referring to FIG. 33, the shape of the first opening 78 of the black matrix 76 may be adjusted to adjust the shape of the first-type pixel 28. Alternatively, when the display screen 1 in the embodiments of the present disclosure is an OLED display screen, referring to FIG. 34, the shape of the second opening 89 of the pixel definition layer 86 may be adjusted to adjust the shape of the first-type pixel 28. Alternatively, when the display screen 1 in the embodiments of the present disclosure is an LED display screen, referring to FIG. 35, the shape of the first-type pixel 28 may be adjusted through an LED 94 of a different shape.

Further, referring to FIG. 41 again, the first pixel edges 36 of the second pixels 37 in the at least two first pixel rows 27 in the pixel group 26 are located on a straight line, to eliminate a step formed by the first pixel edges 36 of the second pixels 37 in multiple first pixel rows 27.

In an embodiment of the present disclosure, referring to FIG. 41 again, the second pixels 37 include a first-type second pixel 38 and a second-type second pixel 39. The second-type second pixel 39 is located between the first-type second pixel 38 and the first pixel 33. An inclination of the first pixel edge 36 of the second-type second pixel 39 is smaller than an inclination of the first pixel edge 36 of the first-type second pixel 38.

The pixel edge of the second-type pixel 29 is a straight edge. Because the second-type second pixel 39 is closer to the second-type pixel 29, the inclination of the first pixel edge 36 may be designed to be smaller to reduce a difference between extension directions of the edges of the second-type second pixel 39 and the second pixel 37.

Further, referring to FIG. 41 again, in a direction from the third sub-edge 25 to the second-type pixel 29, inclinations of the first pixel edges 36 of multiple second pixels 37 in the first pixel row 27 gradually decrease so that the inclinations of the first pixel edges 36 of multiple second pixels 37 in the first pixel row 27 uniformly change in the direction from the third sub-edge 25 to the second-type pixel 29.

Figure 42:
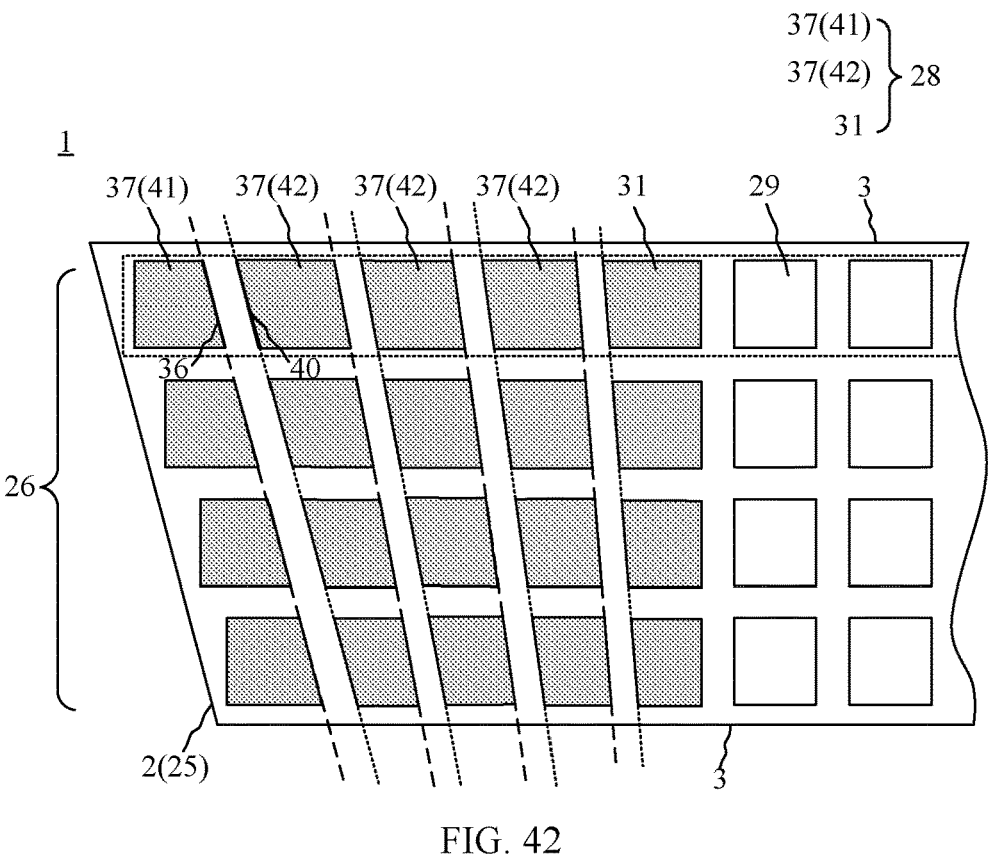
FIG. 42 is a partial structural schematic diagram of a display screen according to another embodiment of the present disclosure.

In an embodiment of the present disclosure, referring to FIG. 42, FIG. 42 is a partial structural schematic diagram of a display screen 1 according to another embodiment of the present disclosure. The first-type pixel 28 includes a second pixel edge 40. The second pixel edge 40 is located at a side close to the third sub-edge 25. The second pixels 37 include a second edge pixel 41 and a second intermediate pixel 42. The second edge pixel 41 is close to the third sub-edge 25. The second intermediate pixel 42 is located between the second edge pixel 41 and the first pixel 33. The second pixel edges 40 of the second intermediate pixel 42 and the first pixel 33 are inclined toward the direction close to the second-type pixel 29 in the direction in which the first width d gradually decreases.

As described above, after the distance between the geometric center points of the first-type pixels 28 in the first pixel rows 27 is adjusted, the first-type pixels 28 in multiple first pixel rows 27 are arranged in the non-aligned manner. Designing the second pixel edge 40 of the second intermediate pixel 42 and the second pixel edge 40 of the first pixel 33 to be inclined can weaken a step between the second pixel edges 40 of the second intermediate pixels 42 in multiple first pixel rows 27 and a step between the second pixel edges

40 of the first pixels 33 in multiple first pixel rows 27, so that serration caused by the non-aligned arrangement of the first-type pixels 28 is further weakened.

Further, referring to FIG. 42 again, the second pixel edges 40 of the second intermediate pixels 42 in the at least two first pixel rows 27 in the pixel group 26 are located on a straight line to eliminate the step between the second pixel edges 40 of the second intermediate pixels 42 in multiple first pixel rows 27. The second pixel edges 40 of the first pixels 33 in the at least two first pixel rows 27 are located on a straight line to eliminate the step between the second pixel edges 40 of the first pixels 33 in multiple first pixel rows 27.

Further, referring to FIG. 42 again, for two adjacent first-type pixels 28 in the arrangement direction of the two first edges 2, the second pixel edge 40 of one first-type pixel 28 is parallel to the first pixel edge 36 of the other first-type pixel 28 so that a distance between the two adjacent first-type pixels 28 is constant, and the display effect is optimized.

Figure 43:
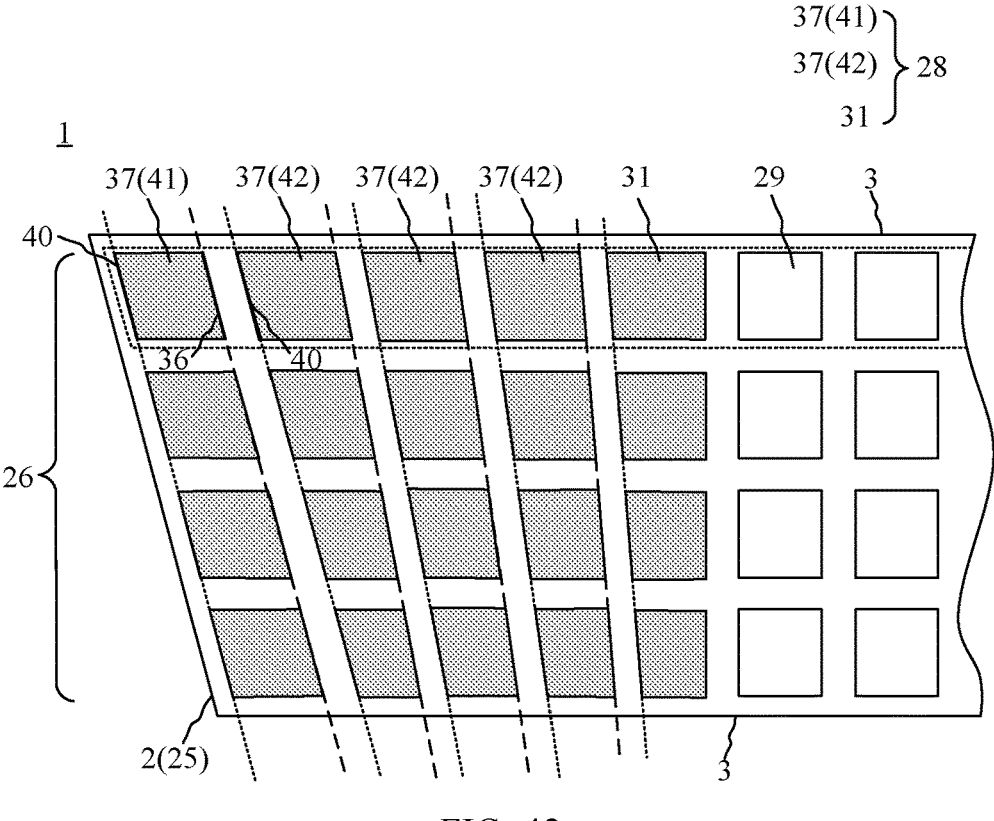
FIG. 43 is a partial structural schematic diagram of a display screen according to another embodiment of the present disclosure.

In an embodiment of the present disclosure, referring to FIG. 43, FIG. 43 is a partial structural schematic diagram of a display screen 1 according to another embodiment of the present disclosure. The second pixel edge 40 of the second edge pixel 41 is parallel to the third sub-edge 25, to further weaken a step between the second pixel edges 40 of the second edge pixels 41 in multiple first pixel rows 27.

Further, referring to FIG. 43 again, the second pixel edges 40 of the second edge pixels 41 in the at least two first pixel rows 27 in the pixel group 26 are located on a straight line, eliminating the step close to the third sub-edge 25.

Figure 44:
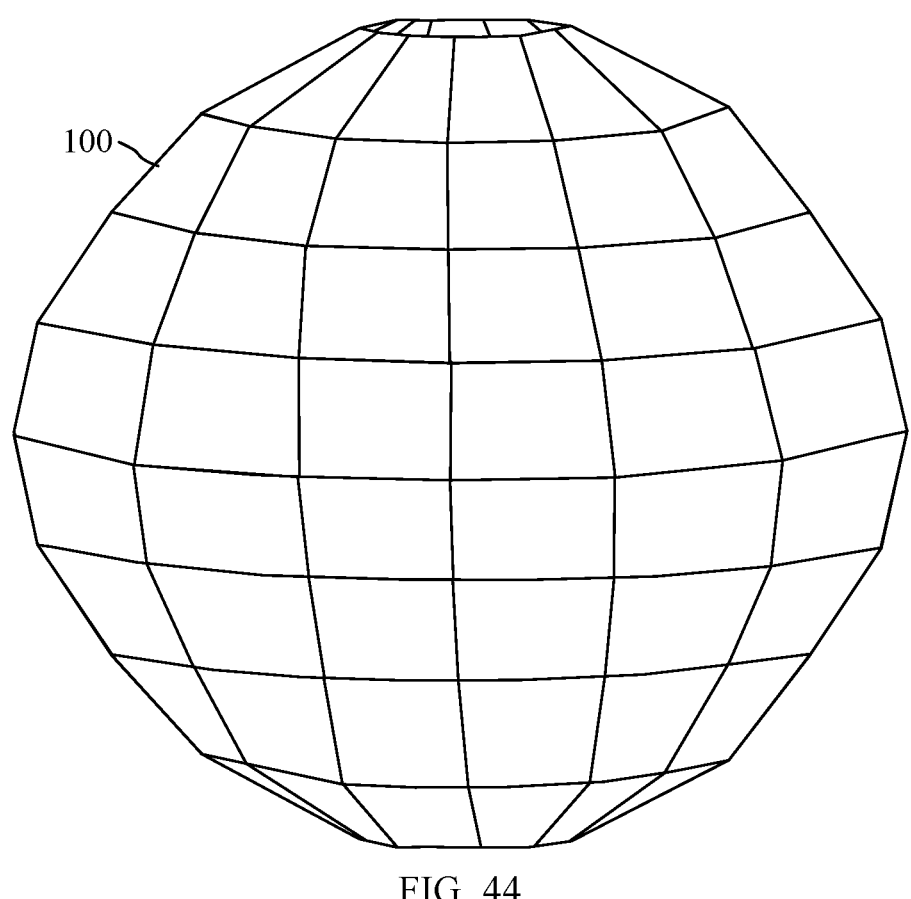
FIG. 44 is a structural schematic diagram of a splicing display apparatus according to an embodiment of the present disclosure.

Based on the same inventive concept, the embodiments of the present disclosure further provide a splicing display apparatus, FIG. 44 is a structural schematic diagram of a splicing display apparatus according to an embodiment of the present disclosure. As shown in FIG. 44, the splicing display apparatus includes the foregoing splicing screen 100. A structure of the splicing screen 100 has been described in detail in the foregoing embodiments. Details are not described herein again.

The above are merely preferred embodiments of the present disclosure, which, as mentioned above, are not used to limit the present disclosure. Whatever within the principles of the present disclosure, including any modification, equivalent substitution, improvement, etc., shall fall into the protection scope of the present disclosure.

Finally, the technical solutions of the present disclosure are illustrated by the above embodiments, but not intended to limit thereto. Although the present disclosure has been described in detail with reference to the foregoing embodiments, those skilled in the art can understand that the present disclosure is not limited to the specific embodiments described herein, and can make various modifications, readjustments, and substitutions without departing from the scope of the present disclosure.

What is claimed is:

1. A splicing screen, comprising display screens, wherein one of the display screens comprises two opposite first edges and two opposite second edges, the two opposite first edges are not parallel to each other, and the two opposite second edges have different lengths;

wherein at least two of the display screens are adjacent to each other, and an angle is formed between two display screens, each of the two display screens being spliced at a corresponding first edge of the two opposite first edges;

wherein the two opposite first edges of one of the display screens comprise a third sub-edge, and the third sub-edge is not perpendicular to the second edge;

one of the display screens comprises a pixel group, the pixel group comprises at least two first pixel rows, the at least two first pixel rows are arranged in an arrangement direction of the two second edges, the first pixel row comprises a second-type pixel and at least two first-type pixels, and the at least two first-type pixels are located between the third sub-edge and the second-type pixel; and one of the display screens has a first width in an arrangement direction of the first edges, the first pixel rows in the pixel group comprise a first pixel sub-row and a second pixel sub-row, the first width of one of the display screens at a position of the first pixel sub-row is greater than the first width of one of the display screens at a position of the second pixel sub-row, and a distance between geometric center points of the first-type pixels in the second pixel sub-row is smaller than a distance between geometric center points of the first-type pixels in the first pixel sub-row.

2. The splicing screen according to claim 1, wherein the two opposite second edges of one of the display screens are parallel to each other.

3. The splicing screen according to claim 1, wherein first virtual axes of the two display screens spliced at the first edge are intersected, are located on a same plane, and are perpendicular to an arrangement direction of the two first edges.

4. The splicing screen according to claim 1, wherein one of the display screens has a first width in an arrangement direction of the two first edges, and the first width of one of the display screens gradually changes.

5. The splicing screen according to claim 1, comprising at least four adjacent display screens, wherein one of the at least four adjacent display screens is spliced with another one of the at least four adjacent display screens at one of the two opposite first edges, and is spliced with another one of the at least four adjacent display screens at one of the two opposite second edges; and the angle is formed between any two adjacent ones of the at least four adjacent display screens.

6. The splicing screen according to claim 5, wherein one of the display screens has a first width in an arrangement direction of the two first edges; and the two opposite second edges of one of the display screens comprise a first sub-edge and a second sub-edge, and for the two display screens spliced at a corresponding second edge of the two opposite second edges, the second sub-edge of one display screen is adjacent to the first sub-edge of another display screen, the first width of one display screen gradually increases in a direction from the first sub-edge to the second sub-edge, and the first width of the another display screen gradually decreases in the direction from the first sub-edge to the second sub-edge; or the first widths of the two display screens both gradually increase or both gradually decrease in the direction from the first sub-edge to the second sub-edge, and the first sub-edge and the second sub-edge adjacent to each other in the two display screens have a same length.

7. The splicing screen according to claim 1, wherein the splicing screen comprises at least one splicing sub-screen, the splicing sub-screen comprises at least two splicing units, the display screens in two adjacent splicing units are spliced at the first edge, and one splicing unit of the two splicing units comprises at least one of the display screens; and the angle is formed between any two adjacent ones of the display screens in the splicing sub-screen.

8. The splicing screen according to claim 7, wherein the one splicing unit comprises at least two of the display screens, and the at least two of the display screens are sequentially spliced at a corresponding second edge of the two opposite second edges; and one display screen has a first width in an arrangement direction of the two first edges, the first widths of the display screens in the splicing unit gradually decrease in an arrangement direction of the display screens, the splicing sub-screen comprises a first side and a second side that are opposite to each other, and in the at least two splicing units of the splicing sub-screen, the first widths of the display screens that is closest to the first side are the smallest or the largest.

9. The splicing screen according to claim 8, wherein the splicing sub-screen comprises a plurality of splicing units, and the splicing unit comprises at least two of display screens, any one of a plurality of display screens comprises a display region and a binding region, and for two adjacent ones of the plurality of display screens in the splicing unit, the display region of one display screen is adjacent to the binding region of the another display screen; or the splicing sub-screen comprises two of the splicing units, and the splicing unit comprises at least two of display screens, one of the display screens comprises a display region and a binding region, and the display regions of the display screens in two of the splicing units are adjacent to each other.

10. The splicing screen according to claim 7, wherein the splicing screen comprises two of the splicing sub-screens, the splicing sub-screen comprises a plurality of the splicing units, and the splicing unit comprises one of the display screens; and wherein one of the display screens comprises a display region and a binding region, and the display regions of the display screens in the two splicing sub-screens are adjacent to each other.

11. The splicing screen according to claim 7, wherein one of the display screens has a first width in an arrangement direction of the two first edges; and the splicing screen comprises two of the splicing sub-screens, a junction is formed between the two splicing sub-screens, one of the two splicing sub-screens is a first splicing sub-screen, and the other is a second splicing sub-screen, first widths of the display screens in a splicing unit in the first splicing sub-screen gradually decrease in a direction from the junction to the first splicing sub-screen, and first widths of the display screens in a splicing unit in the second splicing sub-screen gradually decrease in a direction from the junction to the second splicing sub-screen.

12. The splicing screen according to claim 1, wherein the distance between geometric center points of the first-type pixels in the first pixel sub-row is smaller than or equal to a distance between geometric center points of the second-type pixels in the first pixel sub-row, and the distance between geometric center points of the first-type pixels in the second pixel sub-row is smaller than a distance between geometric center points of the second-type pixels in the second pixel sub-row; or wherein a distance between adjacent first-type pixels in the second pixel sub-row is smaller than a distance between adjacent first-type pixels in the first pixel sub-row; or wherein the first-type pixel has a second width in the arrangement direction of the two first edges, and the second width of the first-type pixel in the second pixel sub-row is smaller than the second width of the first-type pixel in the first pixel sub-row.

13. The splicing screen according to claim 1, wherein first pixels of the plurality of first pixel rows in the pixel group are aligned, and are the first-type pixels closest to the second-type pixel in the first pixel row.

14. The splicing screen according to claim 1, wherein the pixel group comprises a first pixel group and a second pixel group, and the first width of one of the display screens at a position of the first pixel group is greater than the first width of one of the display screens at a position of the second pixel group; and a number of the first-type pixels comprised in the first pixel row in the first pixel group is equal to a number of the first-type pixels comprised in the first pixel row in the second pixel group, a first pixel in the first pixel row in the second pixel group is aligned with the second-type pixel in the first pixel row in the first pixel group, and the first pixel is the first-type pixel closest to the second-type pixel in the first pixel row; or a number of the first-type pixels comprised in the first pixel row in the first pixel group is greater than a number of the first-type pixels comprised in the first pixel row in the second pixel group, a first pixel in the first pixel row in the first pixel group is aligned with a first pixel in the first pixel row in the second pixel group, and the first pixel is the first-type pixel closest to the second-type pixel in the first pixel row.

15. The splicing screen according to claim 1, wherein the first-type pixel comprises a first pixel edge, and the first pixel edge is located at a side close to the second-type pixel;

the first-type pixels in the first pixel row comprise a first pixel and a second pixel, the first pixel is the first-type pixel closest to the second-type pixel, and the second pixel is located between the first pixel and the third sub-edge; and the first width of one of the display screens gradually decreases, and the first pixel edge of the second pixel is inclined toward a direction close to the second-type pixel in a direction in which the first width gradually decreases.

16. The splicing screen according to claim 15, wherein the first pixel edges of the second pixels in the at least two first pixel rows in the pixel group are located on a straight line; or wherein the second pixels comprise a first-type second pixel and a second-type second pixel, the second-type second pixel is located between the first-type second pixel and the first pixel, and an inclination of the first pixel edge of the second-type second pixel is smaller than an inclination of the first pixel edge of the first-type second pixel; or wherein inclinations of the first pixel edges of the plurality of second pixels in the first pixel row gradually decrease in a direction from the third sub-edge to the second-type pixel.

17. The splicing screen according to claim 15, wherein the first-type pixel comprises a second pixel edge, and the second pixel edge is located at a side close to the third sub-edge;

the second pixels comprise a second edge pixel and a second intermediate pixel, the second edge pixel is close to the third sub-edge, and the second intermediate pixel is located between the second edge pixel and the first pixel; and the second pixel edges of the second intermediate pixel and the first pixel are inclined toward the direction close to the second-type pixel in the direction in which the first width gradually decreases.

18. The splicing screen according to claim 17, wherein in the pixel group, second pixel edges of the second intermediate pixels in the at least two first pixel rows are located on a straight line, and second pixel edges of the first pixels in the at least two first pixel rows are located on a straight line; or wherein the second pixel edge of the second edge pixel is parallel to the third sub-edge.

19. A splicing display apparatus, comprising a splicing screen comprising display screens, wherein one of the display screens comprises two opposite first edges and two opposite second edges, the two opposite first edges are not parallel to each other, and the two opposite second edges have different lengths;

wherein at least two of the display screens are adjacent to each other, and an angle is formed between two display screens, each of the two display screens being spliced at a corresponding first edge of the two opposite first edges;

wherein the two opposite first edges of one of the display screens comprise a third sub-edge, and the third sub-edge is not perpendicular to the second edge;

one of the display screens comprises a pixel group, the pixel group comprises at least two first pixel rows, the at least two first pixel rows are arranged in an arrangement direction of the two second edges, the first pixel row comprises a second-type pixel and at least two first-type pixels, and the at least two first-type pixels are located between the third sub-edge and the second-type pixel; and one of the display screens has a first width in an arrangement direction of the first edges, the first pixel rows in the pixel group comprise a first pixel sub-row and a second pixel sub-row, the first width of one of the display screens at a position of the first pixel sub-row is greater than the first width of one of the display screens at a position of the second pixel sub-row, and a distance between geometric center points of the first-type pixels in the second pixel sub-row is smaller than a distance between geometric center points of the first-type pixels in the first pixel sub-row.

20. A splicing screen, comprising display screens, wherein one of the display screens comprises two opposite first edges and two opposite second edges, the two opposite first edges are not parallel to each other, and the two opposite second edges have different lengths;

wherein at least two of the display screens are adjacent to each other, and an angle is formed between two display screens, each of the two display screens being spliced at a corresponding first edge of the two opposite first edges;

wherein the splicing screen comprises two of the splicing sub-screens, the splicing sub-screen comprises a plurality of the splicing units, and the splicing unit comprises one of the display screens; and wherein one of the display screens comprises a display region and a binding region, and the display regions of the display screens in the two splicing sub-screens are adjacent to each other.

* * * * *